(12) United States Patent
Cheng et al.

(10) Patent No.: US 11,581,421 B2
(45) Date of Patent: Feb. 14, 2023

(54) SEMICONDUCTOR DEVICE AND METHOD OF MANUFACTURING THE SAME

(71) Applicant: TAIWAN SEMICONDUCTOR MANUFACTURING COMPANY, LTD., Hsinchu (TW)

(72) Inventors: Chao-Ching Cheng, Hsinchu (TW);
Yu-Lin Yang, Baoshan Township (TW);
Wei-Sheng Yun, Taipei (TW);
Chen-Feng Hsu, Hsinchu (TW);
Tzu-Chiang Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 51 days.

(21) Appl. No.: 17/353,428

(22) Filed: Jun. 21, 2021

(65) Prior Publication Data

US 2021/0313452 A1 Oct. 7, 2021

Related U.S. Application Data

(60) Division of application No. 16/657,747, filed on Oct. 18, 2019, now Pat. No. 11,043,577, which is a
(Continued)

(51) Int. Cl.
*H01L 29/66* (2006.01)
*H01L 29/06* (2006.01)
(Continued)

(52) U.S. Cl.
CPC ........ *H01L 29/66553* (2013.01); *B82Y 10/00* (2013.01); *H01L 21/02532* (2013.01);
(Continued)

(58) Field of Classification Search
CPC ......... H01L 21/02532; H01L 21/02603; H01L 21/30608; H01L 29/0673; H01L 29/42392;
(Continued)

(56) References Cited

U.S. PATENT DOCUMENTS 8,753,942 B2 6/2014 Kuhn et al.
8,796,666 B1 8/2014 Huang et al.
(Continued)

FOREIGN PATENT DOCUMENTS

CN 105518840 A 4/2016
CN 105993064 A 10/2016
(Continued)

OTHER PUBLICATIONS

Notice of Allowance issued in related U.S. Appl. No. 15/941,798, dated May 22, 2019.
(Continued)

*Primary Examiner* — Dao H Nguyen
(74) *Attorney, Agent, or Firm* — McDermott Will & Emery LLP

(57) ABSTRACT

A semiconductor device and a method of manufacturing the same are disclosed. The semiconductor device includes semiconductor wires disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and dielectric spacers disposed in recesses formed toward the source/drain epitaxial layer.

20 Claims, 17 Drawing Sheets

Related U.S. Application Data continuation of application No. 16/512,326, filed on Jul. 15, 2019, now Pat. No. 10,964,798, which is a division of application No. 15/941,798, filed on Mar. 30, 2018, now Pat. No. 10,355,102.

(60) Provisional application No. 62/586,709, filed on Nov. 15, 2017.

(51) Int. Cl.
| | | |
|---|---|---|
| *H01L 29/423* | (2006.01) | |
| *H01L 29/786* | (2006.01) | |
| *H01L 21/02* | (2006.01) | |
| *H01L 21/306* | (2006.01) | |
| *H01L 29/04* | (2006.01) | |
| *H01L 29/775* | (2006.01) | |
| *H01L 29/08* | (2006.01) | |
| *B82Y 10/00* | (2011.01) | |

(52) U.S. Cl.
CPC .. *H01L 21/02603* (2013.01); *H01L 21/30608* (2013.01); *H01L 29/045* (2013.01); *H01L 29/0649* (2013.01); *H01L 29/0673* (2013.01); *H01L 29/0847* (2013.01); *H01L 29/42376* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/78618* (2013.01); *H01L 29/78651* (2013.01); *H01L 29/78654* (2013.01); *H01L 29/78684* (2013.01); *H01L 29/78696* (2013.01); *H01L 2029/42388* (2013.01)

(58) Field of Classification Search
CPC ......... H01L 29/66545; H01L 29/66553; H01L 29/66742; H01L 29/775; H01L 29/78618; H01L 29/78696; H01L 29/78651; H01L 29/78684; H01L 29/0649; H01L 2029/42388
USPC ....................................................... 257/347
See application file for complete search history.

(56) References Cited

U.S. PATENT DOCUMENTS

| | | |
|---|---|---|
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,171,929 B2 | 10/2015 | Lee et al. |
| 9,214,555 B2 | 12/2015 | Oxland et al. |
| 9,236,267 B2 | 1/2016 | De et al. |
| 9,501,601 B2 | 11/2016 | Chang et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,653,289 B1 | 5/2017 | Balakrishnan et al. |
| 9,786,774 B2 | 10/2017 | Colinge et al. |
| 9,842,777 B2 | 12/2017 | Witters et al. |
| 9,853,101 B2 | 12/2017 | Peng et al. |
| 9,876,114 B2 | 1/2018 | JangJian et al. |
| 9,881,993 B2 | 1/2018 | Ching et al. |
| 9,882,023 B2 | 1/2018 | Lin et al. |
| 9,947,804 B1 * | 4/2018 | Frougier ........... H01L 29/66439 |
| 10,249,709 B2 | 4/2019 | Cheng et al. |
| 10,367,061 B1 * | 7/2019 | Loubet .............. H01L 29/66795 |
| 10,749,030 B2 * | 8/2020 | Jeong ................ H01L 27/0688 |
| 2012/0138886 A1 | 6/2012 | Kuhn et al. |
| 2014/0225065 A1 | 8/2014 | Rachmady et al. |
| 2015/0380313 A1 | 12/2015 | Ching et al. |
| 2016/0104793 A1 | 4/2016 | Ching |
| 2017/0222006 A1 * | 8/2017 | Suh ................... H01L 29/42392 |
| 2017/0222024 A1 | 8/2017 | Bergendahl et al. |
| 2019/0319028 A1 * | 10/2019 | Suh ...................... H01L 27/0924 |
| 2019/0393102 A1 * | 12/2019 | Chiang ............. H01L 29/66545 |

FOREIGN PATENT DOCUMENTS

| | | |
|---|---|---|
| CN | 106030815 A | 10/2016 |
| TW | 201405806 A | 2/2014 |
| TW | 201719886 A | 6/2017 |

OTHER PUBLICATIONS

Non-Final Office Action issued in U.S. Appl. No. 16/512,326, dated Apr. 15, 2020.

Final Office Action issued in U.S. Appl. No. 16/512,326, dated Sep. 4, 2020.

Notice of Allowance issued in U.S. Appl. No. 16/512,326, dated Nov. 24, 2020.

Non-Final Office Action issued in U.S. Appl. No. 16/657,747, dated Oct. 14, 2020.

Notice of Allowance issued in U.S. Appl. No. 16/657,747, dated Feb. 19, 2021.

* cited by examiner

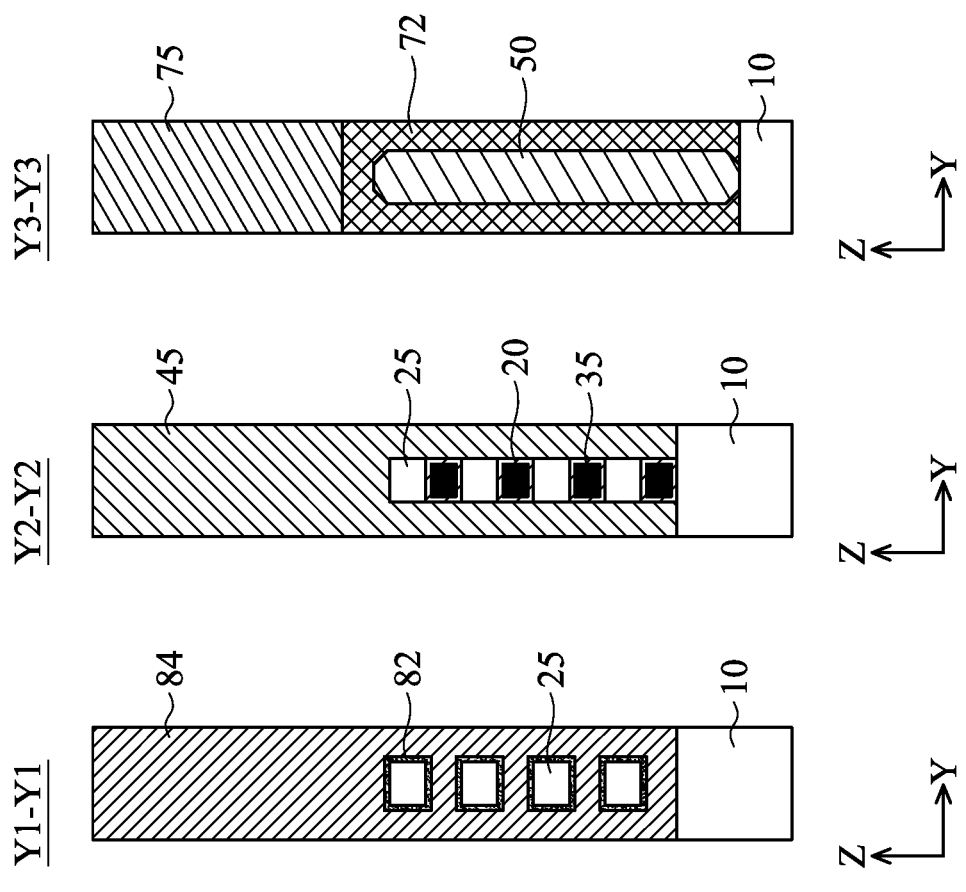
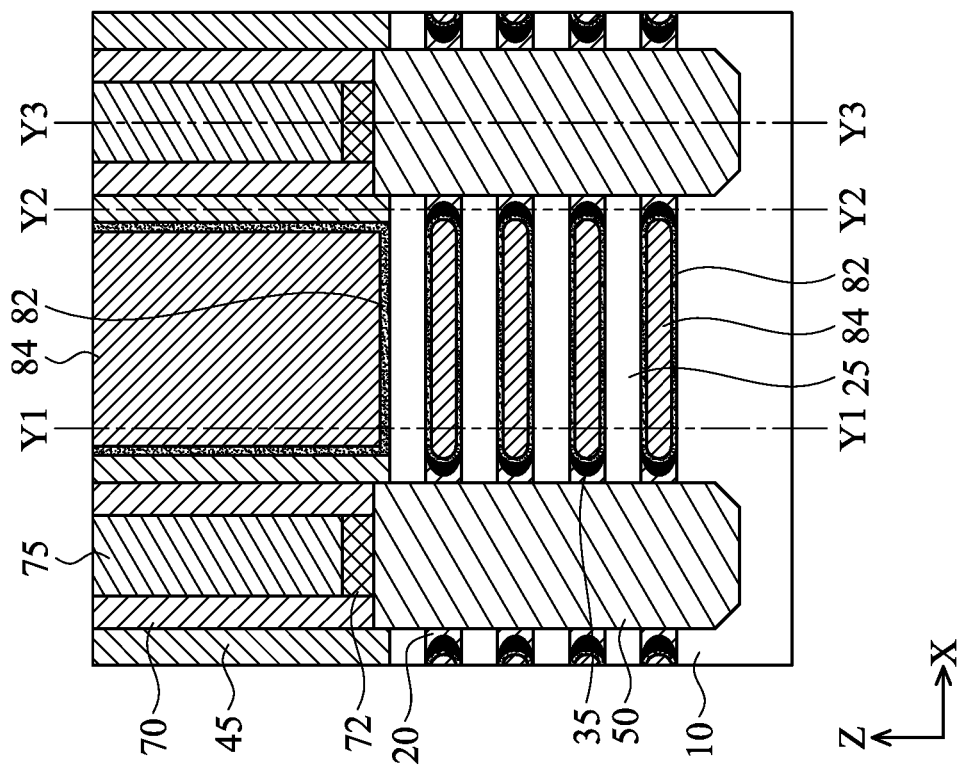
FIG. 1A  FIG. 1B  FIG. 1C  FIG. 1D

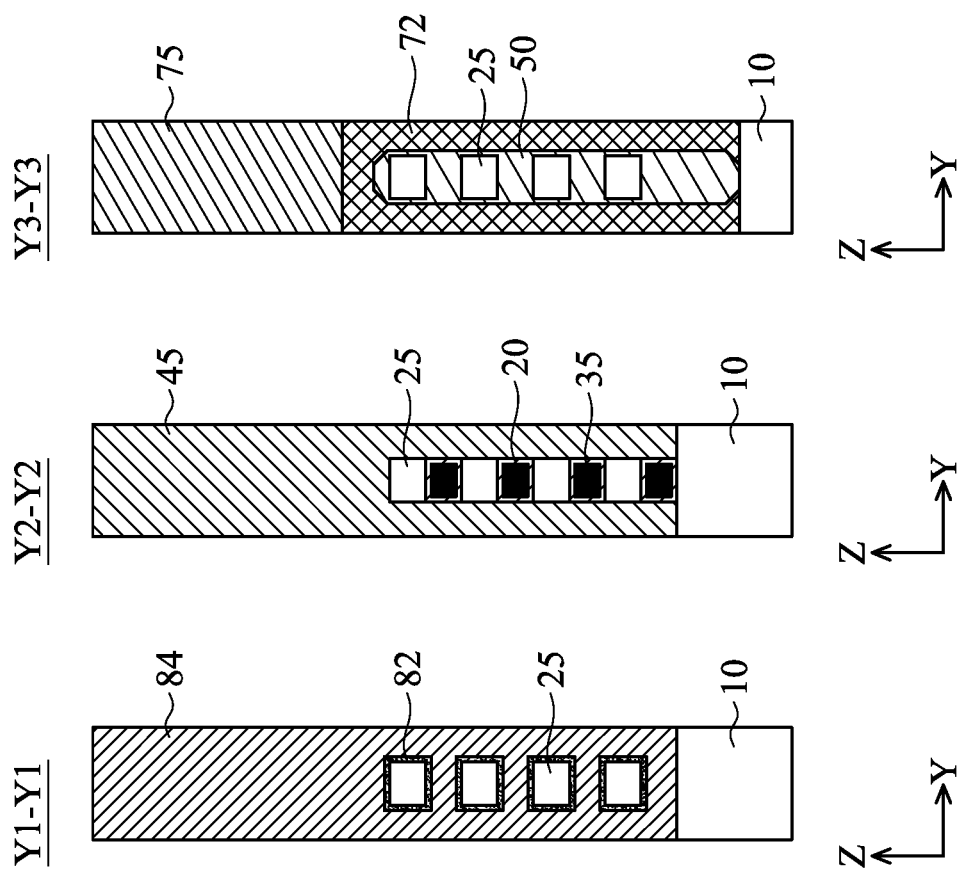
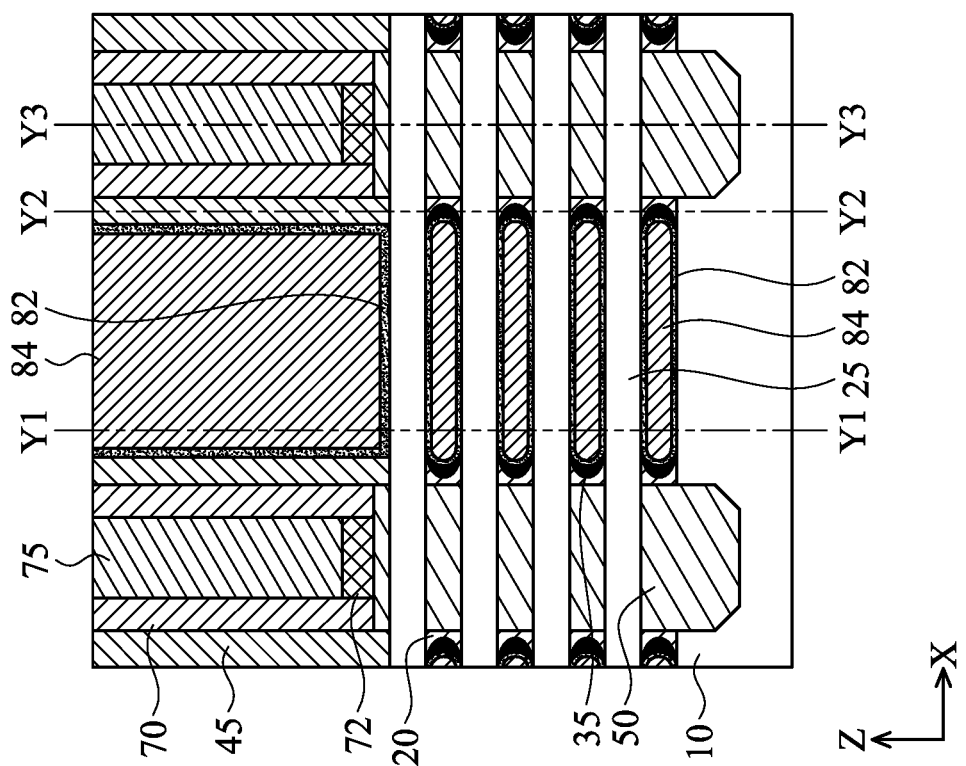
FIG. 2A  FIG. 2B  FIG. 2C  FIG. 2D

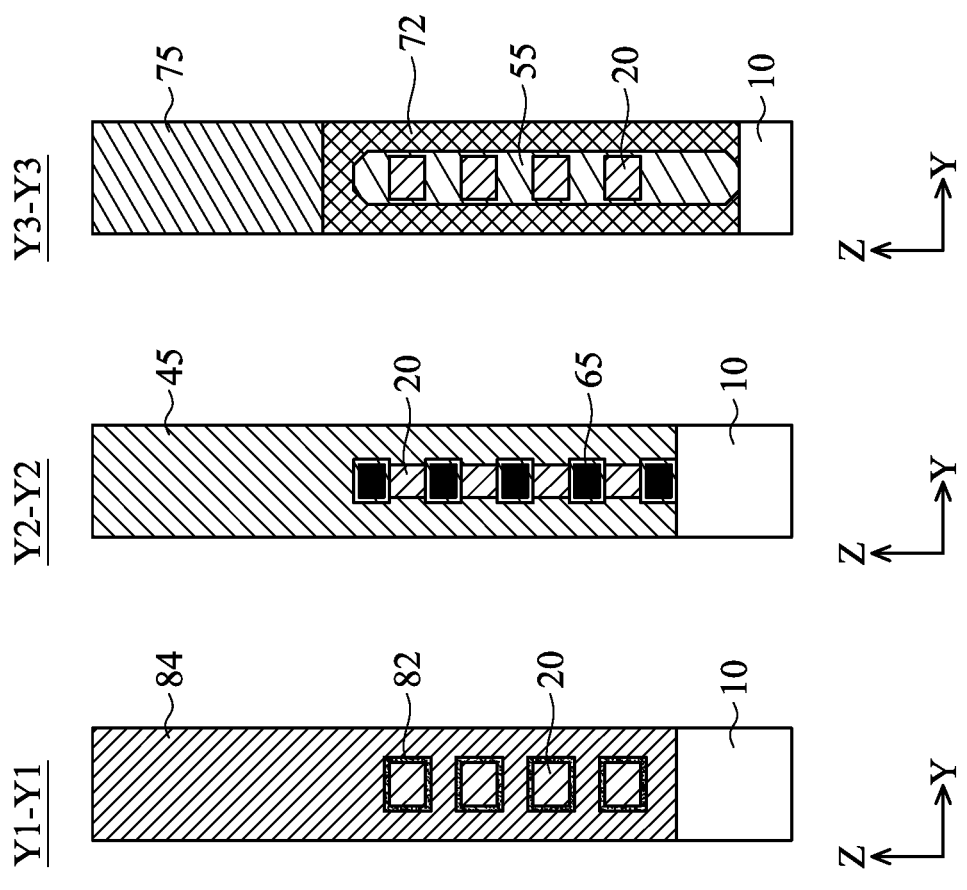
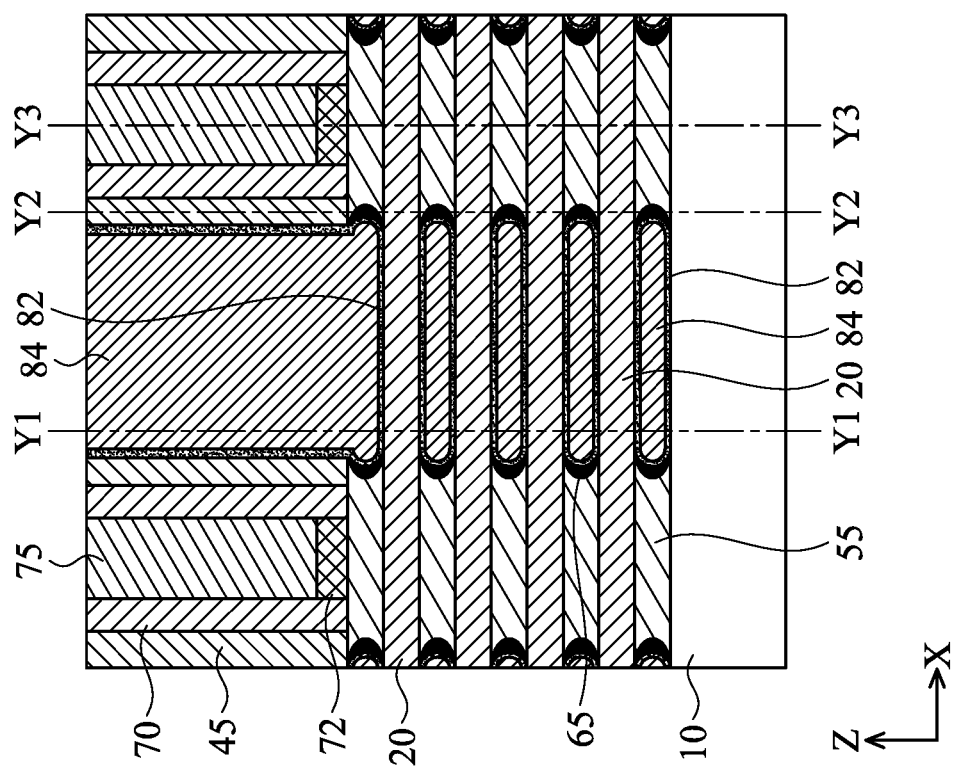
FIG. 4A  FIG. 4B  FIG. 4C  FIG. 4D

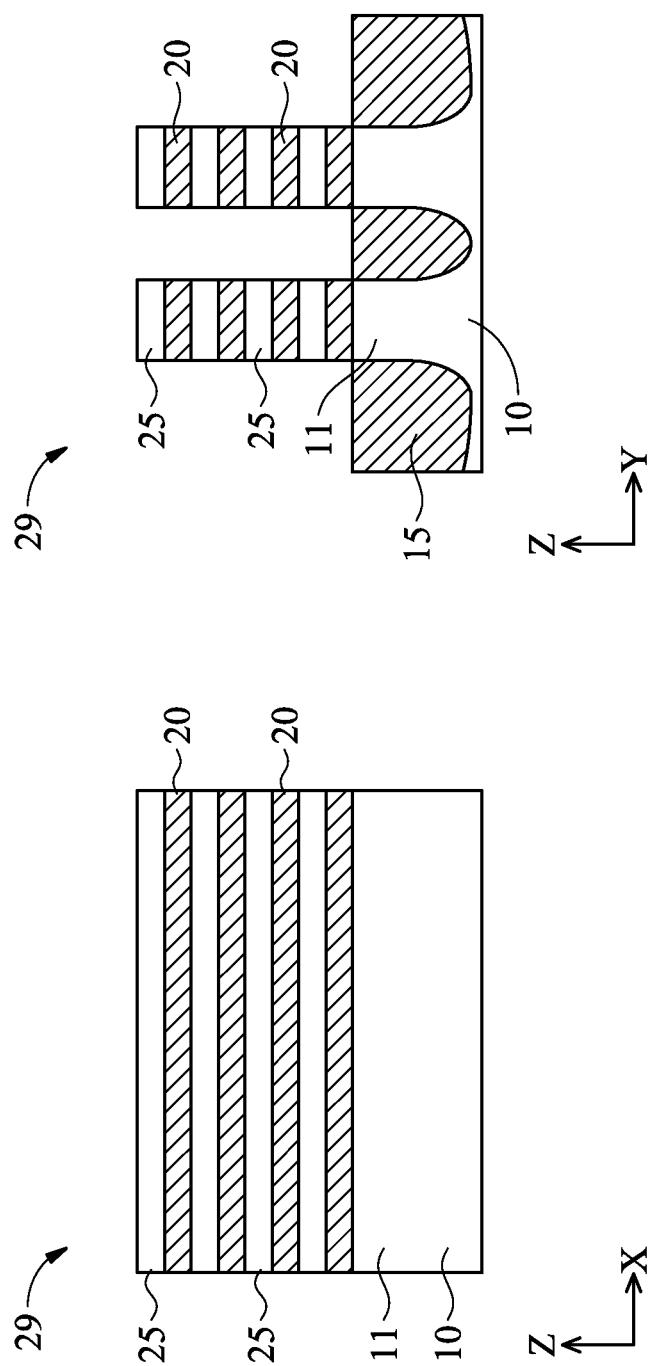

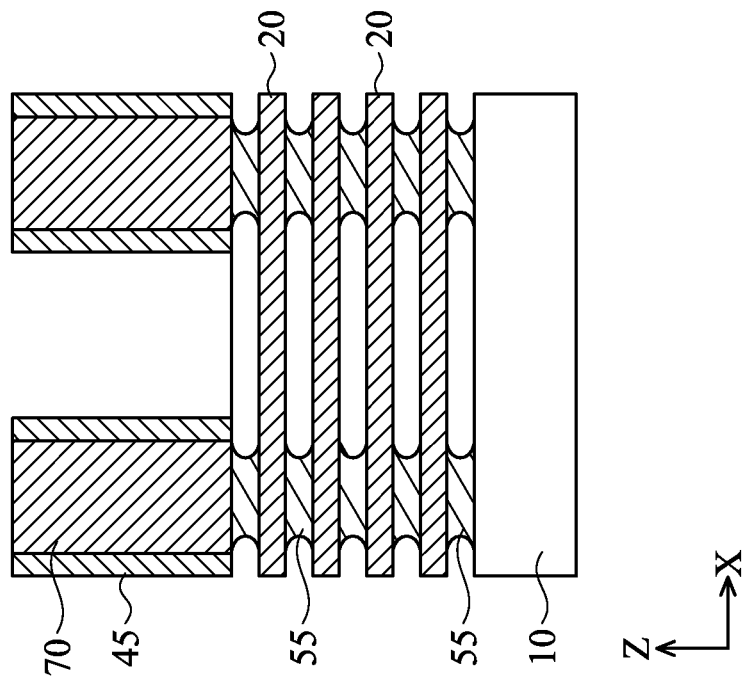
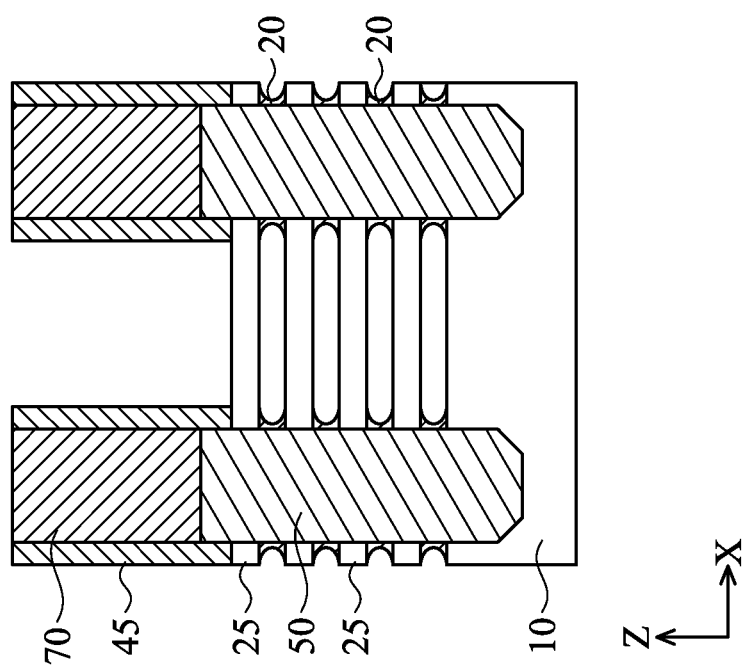
FIG. 13A
FIG. 13B

SEMICONDUCTOR DEVICE AND METHOD OF MANUFACTURING THE SAME

CROSS-REFERENCE TO RELATED APPLICATIONS

This application is a divisional of U.S. patent application Ser. No. 16/657,747 filed Oct. 18, 2019, now U.S. Pat. No. 11,043,577, which is a continuation of U.S. patent application Ser. No. 16/512,326 filed on Jul. 15, 2019, now U.S. Pat. No. 10,964,798, which is a divisional of U.S. patent application Ser. No. 15/941,798 filed Mar. 30, 2018, now U.S. Pat. No. 10,355,102, which claims priority to U.S. Provisional Patent Application 62/586,709 filed on Nov. 15, 2017, the entire disclosure of each of which applications are incorporated herein by reference.

TECHNICAL FIELD

The disclosure relates to methods of manufacturing semiconductor integrated circuits, and more particularly to methods of manufacturing semiconductor devices including fin field effect transistors (FinFETs) and/or gate-all-around (GAA) FETs, and semiconductor devices.

BACKGROUND

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1D show various views of a semiconductor FET device according to an embodiment of the present disclosure. FIG. 1A shows a cross sectional view along the X direction (source-to-drain direction), FIG. 1B shows a cross sectional view along the Y1-Y1 direction of FIG. 1A, FIG. 1C shows a cross sectional view along the Y2-Y2 direction of FIG. 1A, and FIG. 1D shows a cross sectional view along the Y3-Y3 direction of FIG. 1A.

FIGS. 2A-2D show various views of a semiconductor FET device according to another embodiment of the present disclosure. FIG. 2A shows a cross sectional view along the X direction (source-to-drain direction), FIG. 2B shows a cross sectional view along the Y1-Y1 direction of FIG. 2A, FIG. 2C shows a cross sectional view along the Y2-Y2 direction of FIG. 2A, and FIG. 2D shows a cross sectional view along the Y3-Y3 direction of FIG. 2A.

FIG. 3A shows a cross sectional view along the X direction (source-to-drain direction), FIG. 3B shows a cross sectional view along the Y1-Y1 direction of FIG. 3A, FIG. 3C shows a cross sectional view along the Y2-Y2 direction of FIG. 3A, and FIG. 3D shows a cross sectional view along the Y3-Y3 direction of FIG. 3A.

FIGS. 4A-4D show various views of a semiconductor FET device according to another embodiment of the present disclosure. FIG. 4A shows a cross sectional view along the X direction (source-to-drain direction), FIG. 4B shows a cross sectional view along the Y1-Y1 direction of FIG. 4A, FIG. 4C shows a cross sectional view along the Y2-Y2 direction of FIG. 1A, and FIG. 4D shows a cross sectional view along the Y3-Y3 direction of FIG. 4A.

FIGS. 5A and 5B show one of the various operations of manufacturing a semiconductor GAA FET device according to an embodiment of the present disclosure.

FIG. 7A shows a cross sectional view for an n-type GAA FET, and FIG. 7B shows a cross sectional view for a p-type GAA FET.

FIG. 8A shows a cross sectional view for an n-type GAA FET, and FIG. 8B shows a cross sectional view for a p-type GAA FET.

FIG. 9A shows a cross sectional view for an n-type GAA FET, and FIG. 9B shows a cross sectional view for a p-type GAA FET.

FIG. 10A shows a cross sectional view for an n-type GAA FET, and FIG. 10B shows a cross sectional view for a p-type GAA FET.

FIG. 11A shows a cross sectional view for an n-type GAA FET, and FIG. 11B shows a cross sectional view for a p-type GAA FET.

FIG. 12A shows a cross sectional view for an n-type GAA FET, and FIG. 12B shows a cross sectional view for a p-type GAA FET.

FIGS. 13A and 13B show one of the various operations of manufacturing a semiconductor GAA FET device according to an embodiment of the present disclosure. FIG. 13A shows a cross sectional view for an n-type GAA FET, and FIG. 13B shows a cross sectional view for a p-type GAA FET.

FIG. 14A shows a cross sectional view for an n-type GAA FET, and FIG. 14B shows a cross sectional view for a p-type GAA FET.

FIG. 15A shows a cross sectional view for an n-type GAA FET, and FIG. 15B shows a cross sectional view for a p-type GAA FET.

FIG. 16A shows a cross sectional view for an n-type GAA FET, and FIG. 16B shows a cross sectional view for a p-type GAA FET.

DETAILED DESCRIPTION

Figures 3A, 3B, 3C, 3D:
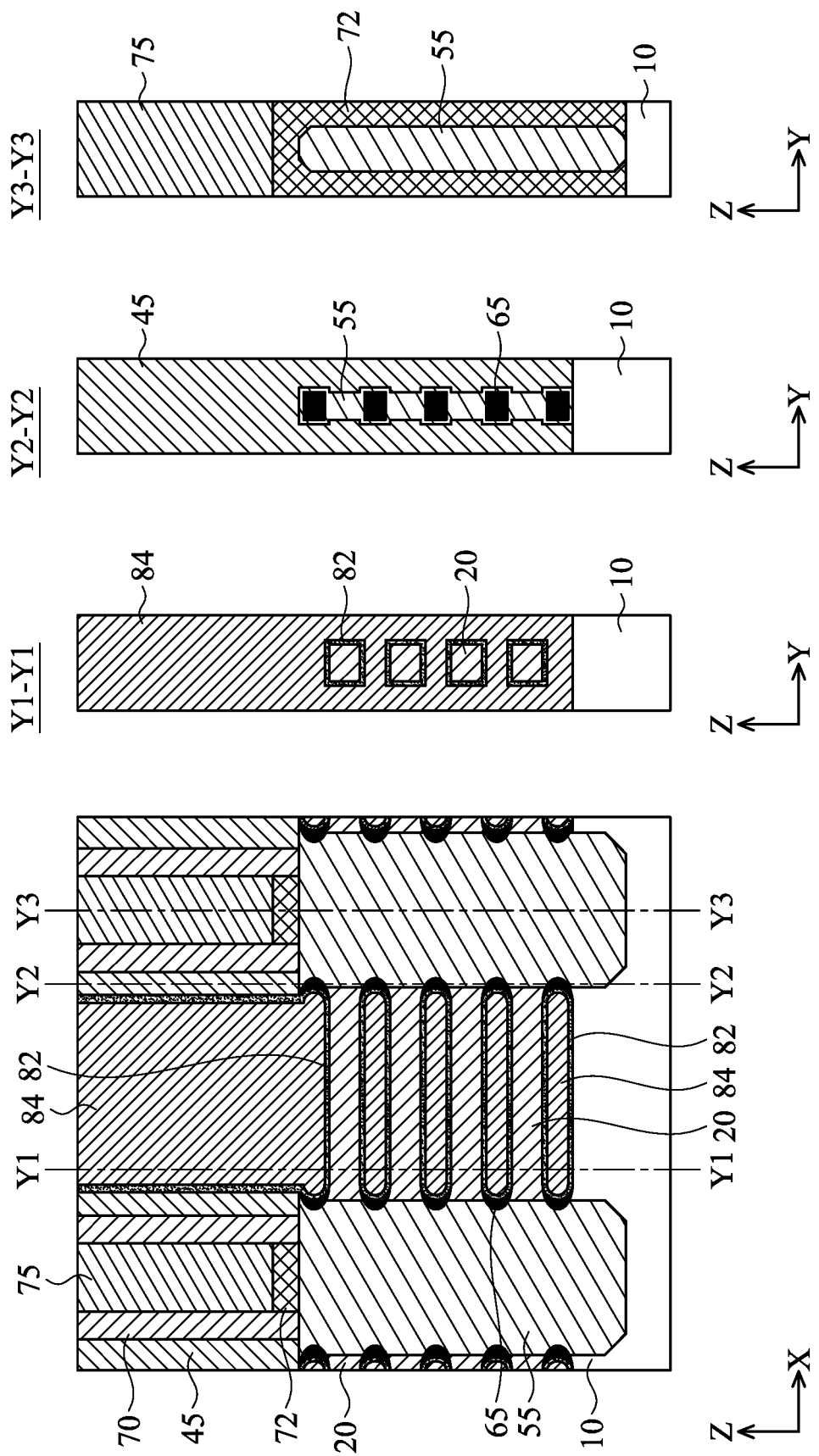
FIGS. 3A-3D show various views of a semiconductor FET device according to another embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after a dummy poly gate is removed, because a lateral etching control or an etching budget for NW release etching may not be sufficient. A gate electrode may touch a source/drain epitaxial layer if there is no etch stop layer. Further, there is a larger impact on gate-to-drain capacitance Cgd. If no dielectric film existed between the gate and the source/drain region, Cgd becomes larger, which would reduce circuit speed.

In a GAA FET, an inner spacer is provided between a metal gate electrode and a source/drain epitaxial layer. However, it is difficult to uniformly form inner spacers due to process variations not only in each device but also within the overall wafer, and/or wafer-to-wafer variations. Further, it is necessary to provide better gate control for a GAA FET having inner spacers. The inner spacers act as an extra resource of channel resistance, thereby hindering the gate control capability. A higher channel height in a GAA FET causes more difficulties in deposition and etching processes, to more precisely control a uniformity of the structure from the channel bottom to the channel top. In particular, achieving higher process uniformity within a 12-inch wafer becomes more difficult in a GAA FET fabrication operation.

In the present disclosure, a novel method for fabricating an inner spacer between a metal gate electrode and a source/drain epitaxial layer for a GAA FET and a stacked channel FET are provided. In particular, in the present disclosure, the inner spacer has a cross sectional shape formed in a recess (i.e. a portion of the inner spacer having a surface of an indented shape) provided in a region not overlapping the gate electrode. In some embodiments, the recess is provided in the source/drain regions. By employing the inner spacer, it is possible to provide more space for a gate dielectric layer and a gate electrode, thereby improving the gate control capability.

In this disclosure, a source/drain refers to a source and/or a drain. It is noted that in the present disclosure, a source and a drain are interchangeably used and the structures thereof are substantially the same.

FIGS. 1A-1D show various views of a semiconductor GAA FET device according to an embodiment of the present disclosure. FIG. 1A is a cross sectional view along the X direction (source-to-drain direction), FIG. 1B is a cross sectional view along the Y1-Y1 direction of FIG. 1A, FIG. 1C is a cross sectional view along the Y2-Y2 direction of FIG. 1A, and FIG. 1D shows a cross sectional view along the Y3-Y3 direction of FIG. 1A.

As shown in FIGS. 1A-1C, semiconductor wires 25 are provided over a semiconductor substrate 10, and vertically arranged along the Z direction (the normal direction of the principal surface of the substrate 10). In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires 25, which are channel layers, are disposed over the substrate 10.

In some embodiments, the semiconductor wires 25 are disposed over a fin structure 11 (FIG. 5) protruding from the substrate 10. Each of the channel layers 25 is wrapped around by a gate dielectric layer 82 and a gate electrode layer 84. The thickness of the semiconductor wires 25 is in a range from about 5 nm to about 15 nm and the width of the semiconductor wires 25 is in a range from about 5 nm to about 15 nm in some embodiments. In some embodiments, the gate dielectric layer 82 includes an interfacial layer and a high-k dielectric layer. The gate structure includes the gate dielectric layer 82, the gate electrode layer 84 and sidewall spacers 45. Although FIGS. 1A-1C show four semiconductor wires 25, the number of the semiconductor wires 25 is not limited to four, and may be as small as one or more than four and may be up to ten. By adjusting the numbers of the semiconductor wires, a driving current of the GAA FET device can be adjusted. In some embodiments, both n and p-type source/drain are with or without wires 25.

Further, a source/drain epitaxial layer 50 is disposed over the substrate 10 as shown in FIGS. 1A and 1D. In some embodiments, the source/drain epitaxial layer 50 is in direct contact with end faces of the channel layer 25, and is separated from the electrically conducting gate electrode layer 84 by insulating inner spacers 35 and the gate dielectric layer 82. In some embodiments, an additional insulating layer (not shown) is conformally formed on the inner surface of the spacer regions. As shown in FIG. 1A, the cross section along the X direction of the inner spacer 35 has a cross-sectional shape filling a recess in the source/drain region and not in the channel region.

An interlayer dielectric (ILD) layer 70 is disposed over the source/drain epitaxial layer 50 and a conductive contact layer 72 is disposed on the source/drain epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium.

FIGS. 2A-2D show various views of a semiconductor FET device according to another embodiment of the present disclosure. FIG. 2A is a cross sectional view along the X direction (source-to-drain direction), FIG. 2B is a cross sectional view along the Y1-Y1 direction of FIG. 2A, FIG. 2C is a cross sectional view along the Y2-Y2 direction of FIG. 2A, and FIG. 2D shows a cross sectional view along the Y3-Y3 direction of FIG. 2A. Material, configuration, dimensions and/or processes the same as or similar to the foregoing embodiments described with respect to FIGS. 1A-1D may be employed in the embodiment of FIGS. 2A-2D, and detailed explanation thereof may be omitted.

In this embodiment, the source/drain epitaxial layer 50 wraps around portions of the semiconductor wires 25 disposed at the source/drain regions, or the semiconductor wires 25 pass through the source/drain epitaxial layer 50.

In the embodiments of FIGS. 1A-1D and 2A-2D, the GAA FET is an n-type GAA FET. The semiconductor wires 25 are made of Si or $Si_{1-x}Ge_x$, where x is equal to or less than 0.2. The source/drain epitaxial layer 50 is made of one or more of Si, Si:P (P doped Si), SiC or SiCP (P doped SiC). In some embodiments, both n and p-type source/drain are with or without wires 25.

FIGS. 3A-3D show various views of a semiconductor FET device according to another embodiment of the present disclosure. FIG. 3A is a cross sectional view along the X direction (source-to-drain direction), FIG. 3B is a cross sectional view along the Y1-Y1 direction of FIG. 3A, FIG. 3C is a cross sectional view along the Y2-Y2 direction of FIG. 3A, and FIG. 3D shows a cross sectional view along the Y3-Y3 direction of FIG. 3A. Material, configuration, dimensions and/or processes the same as or similar to the foregoing embodiments described with respect to FIGS. 1A-2D may be employed in the embodiment of FIGS. 3A-3D, and detailed explanation thereof may be omitted.

In the embodiments of FIGS. 3A-3D, the GAA FET shown in FIGS. 3A-3D is a p-type GAA FET. The semiconductor wires 20, which are channel layers and are made of $Si_{1-x}Ge_x$, where x is equal to or more than about 0.2 (hereinafter may be merely referred to as SiGe), are disposed over the substrate 10. In some embodiments, the semiconductor wires 20 are disposed over a fin structure 11 (FIG. 5A) protruding from the substrate 10. The thickness of the semiconductor wires 20 is in a range from about 5 nm to about 15 nm and the width of the semiconductor wires 20 is in a range from about 5 nm to about 15 nm in some embodiments. Each of the channel layers 20 is wrapped around by a gate dielectric layer 82 and a gate electrode layer 84. In some embodiments, the gate dielectric layer 82 includes an interfacial layer and a high-k dielectric layer. The gate structure includes the gate dielectric layer 82, the gate electrode layer 84 and sidewall spacers 45. Although FIGS. 3A-3C show four semiconductor wires 20, the number of the semiconductor wires 20 is not limited to four, and may be as small as one or more than four and may be up to ten.

A source/drain epitaxial layer 55 is disposed over the substrate 10, as shown in FIGS. 3A and 3D. The source/drain epitaxial layer 55 is in direct contact with end faces of the channel layers 20, and is separated from the electrically conducting layer of gate electrode layer 84 by insulating layers of insulating inner spacers 65 and the gate dielectric layer 82. The source/drain epitaxial layer 55 is made of one or more of Si, SiGe and SiGeB. In some embodiments, an additional insulating layer (not shown) is conformally formed on the inner surface of the spacer regions. In some embodiments, both n and p-type source/drain are with or without wires 20.

As shown in FIG. 3A, the inner spacer 65 has a cross sectional shape along the X direction formed in a recess formed in the source/drain region and not in the channel region. In some embodiments, the inner spacers 65 are disposed above the uppermost semiconductor wire 20 along z direction.

FIGS. 4A-4D show various views of a p-type GAA FET device according to another embodiment of the present disclosure. FIG. 4A is a cross sectional view along the X direction (source-to-drain direction), FIG. 4B is a cross sectional view corresponding to Y1-Y1 of FIG. 4A, FIG. 4C is a cross sectional view corresponding to Y2-Y2 of FIG. 4A and FIG. 4D shows a cross sectional view corresponding to Y3-Y3 of FIG. 4A. Material, configuration, dimensions and/or processes the same as or similar to the foregoing embodiments described with respect to FIGS. 1A-3D may be employed in the embodiment of FIGS. 4A-4D, and detailed explanation thereof may be omitted.

In this embodiment, the source/drain epitaxial layer 55 wraps around end portions of the semiconductor wires 20 disposed at the source/drain regions, or the semiconductor wires 20 pass through the source/drain epitaxial layer 55. In some embodiments, both n and p-type source/drain are with or without wires 20.

In some embodiments, two or more of the GAA FETs shown in FIGS. 1A-4D are disposed on one semiconductor substrate (chip) to achieve various circuit functions.

FIGS. 5A to 20B show various operations of manufacturing a semiconductor FET device according to an embodiment of the present disclosure. In FIGS. 7A-20B, the "A" figures (or left figures) are cross sectional views along the X direction (i.e. the source-to-drain direction) for an n-type GAA FET, and the "B" figures (or right figure) are cross sectional views along the X direction for a p-type GAA FET. It is understood that additional operations can be provided before, during, and after processes shown by FIGS. 5A-20B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-4D may be employed in the embodiment of FIGS. 5A-20B, and detailed explanation thereof may be omitted.

As shown in FIGS. 5A and 5B, fin structures 29, in which first semiconductor layers 20 and second semiconductor layers 25 are alternately stacked on a bottom fin 11, are formed over the substrate 10. The fin structures 29 protrude from an isolation insulating layer 15. The fin structures 29 can be formed by the following operations.

Stacked semiconductor layers are formed over the substrate 10. The stacked semiconductor layers include the first semiconductor layers 20 and the second semiconductor layers 25. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.2, or Ge (x=1.0) and the second semiconductor layers 25 are Si or $Si_{1-y}Ge_y$, where y is equal to or less than about 0.2. In this disclosure, an "M compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer including a first mask layer and a second mask layer is formed over the stacked layers. The first mask layer is a pad oxide layer made of a silicon oxide, which can be formed by a thermal oxidation. The second mask layer is made of a silicon nitride, which is formed by chemical vapor deposition (CVD), including low pressure CVD (LPCVD) and plasma enhanced CVD (PECVD), physical vapor deposition (PVD), atomic layer deposition (ALD), or other suitable process. The mask layer is patterned into a mask pattern by using patterning operations including photo-lithography and etching.

Next, the stacked layers of the first and second semiconductor layers 20, 25 are patterned by using the patterned mask layer, thereby the stacked layers are formed into fin structures 29 extending in the X direction, as shown in FIGS. 5A and 5B. In FIG. 5B, two fin structures 29 are arranged in the Y direction. But the number of the fin structures is not limited to two, and may be as small as one or three or more. In some embodiments, one or more dummy fin structures are formed on both sides of the fin structures 29 to improve pattern fidelity in the patterning operations. As shown in FIG. 5B the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29. By using this spacer patterning technique, a device feature smaller than the smallest value allowed in photolithographic and etching methods can be produced.

After the fin structures 29 are formed, an insulating material layer 15 (also called "isolation insulating layer") including one or more layers of insulating material is formed over the substrate so that the fin structures are fully embedded in the insulating layer. The insulating material for the insulating layer 15 may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one of more fin liner layers (not shown) are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 5B, the insulating material layer is recessed to form the isolation insulating layer 15 so that the upper portions of the fin structures 29 are exposed. With this operation, the fin structures 29 are separated from each other by the isolation insulating layer 15, which is also called a shallow trench isolation (STI). In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of an n-type GAA FET. For a p-type GAA FET, the second semiconductor layers 25 are sacrificial layers which are subsequently partially removed, and the first semiconductor layers 20 are subsequently formed into semiconductor wires as channel layers.

Figure 6A:
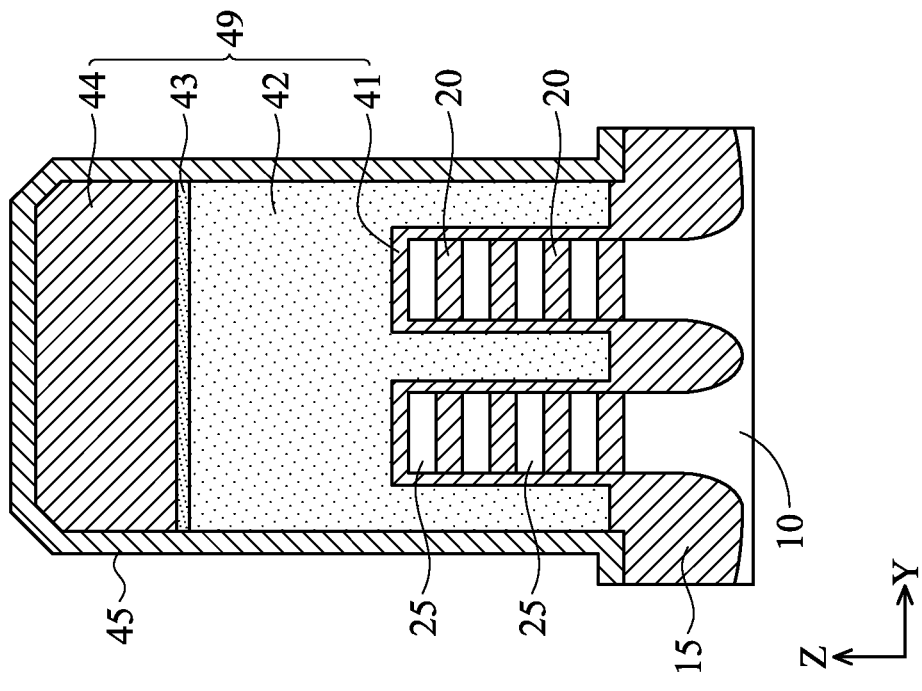
FIGS. 6A and 6B show one of the various operations of manufacturing a semiconductor GAA FET device according to an embodiment of the present disclosure.
Figure 6B:
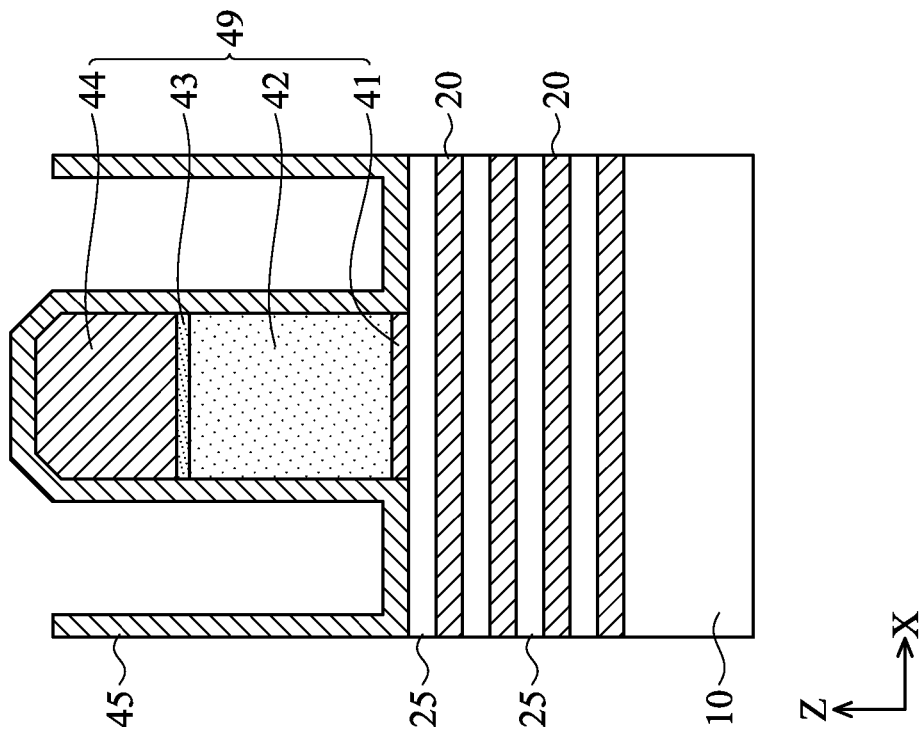

After the isolation insulating layer 15 is formed, a sacrificial (dummy) gate structure 49 is formed over the exposed fin structures, as shown in FIGS. 6A and 6B. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 49, as shown in FIGS. 6A and 6B. The sacrificial gate structure includes the sacrificial gate dielectric layer 41, the sacrificial gate electrode layer 42 (e.g. poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain (source/drain) regions, as shown in FIGS. 6A and 6B. In this disclosure, a source and a drain are interchangeably used and the structures thereof are substantially the same. In FIGS. 6A and 6B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for forming sidewall spacers is formed over the sacrificial gate structure 49, as shown in FIGS. 6A and 6B. The first cover layer 45 is deposited in a conformal manner so that it is formed to have substantially equal thicknesses on vertical surfaces, such as the sidewalls, horizontal surfaces, and the top of the sacrificial gate structure, respectively. The first cover layer 45 includes one or more of $Si_3N_4$, $N_2OSi_2$, SiCN, SiCO, SiOCN or any other suitable dielectric material. The cover layer 45 can be formed by ALD or CVD, or any other suitable method.

Figure 7A:
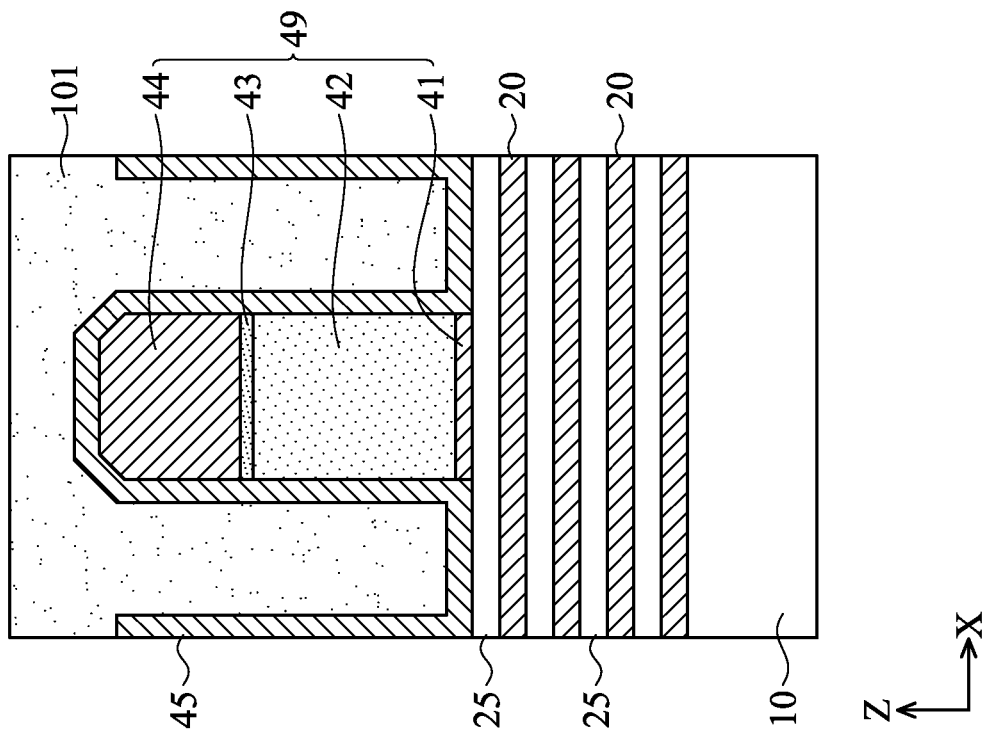
FIGS. 7A and 7B show one of the various operations of manufacturing a semiconductor GAA FET device according to an embodiment of the present disclosure.
Figure 7B:
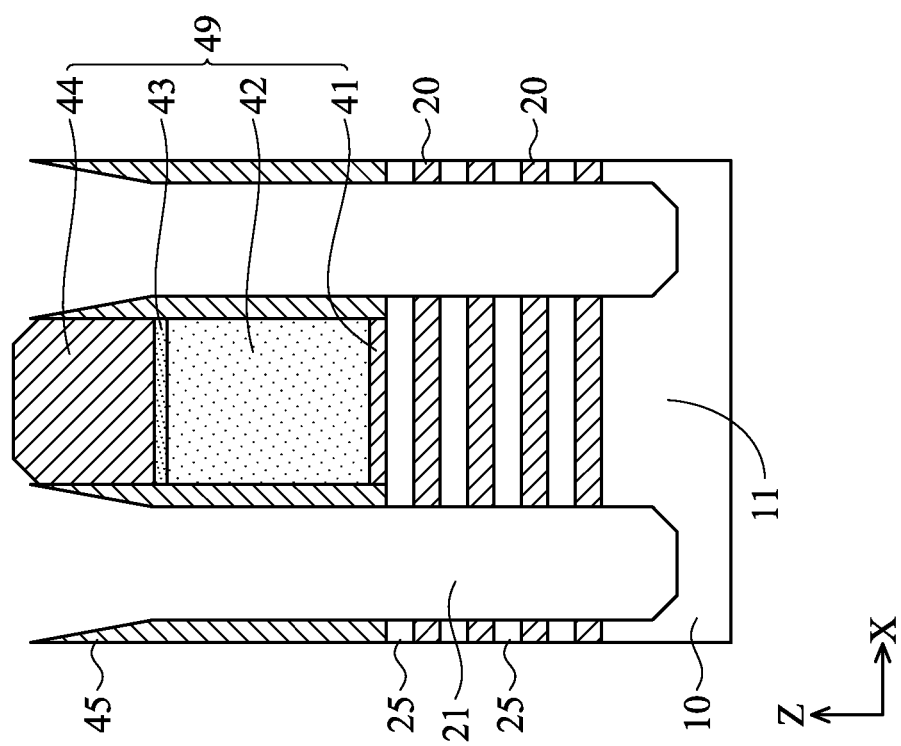

FIG. 7A shows a cross sectional view along the X direction in an n-type region, and FIG. 7B shows a cross sectional view along the X direction in a p-type region. Next, the p-type region is covered by a protective layer 101, such a photo resist layer, as shown in FIG. 7B. In the n-type region (FIG. 7A), the first cover layer 45 is anisotropically etched to remove the first cover layer 45 disposed on the source/drain region, while leaving the first cover layer 45 as sidewall spacers on side faces of the sacrificial gate structure 49. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched.

Figure 8A:
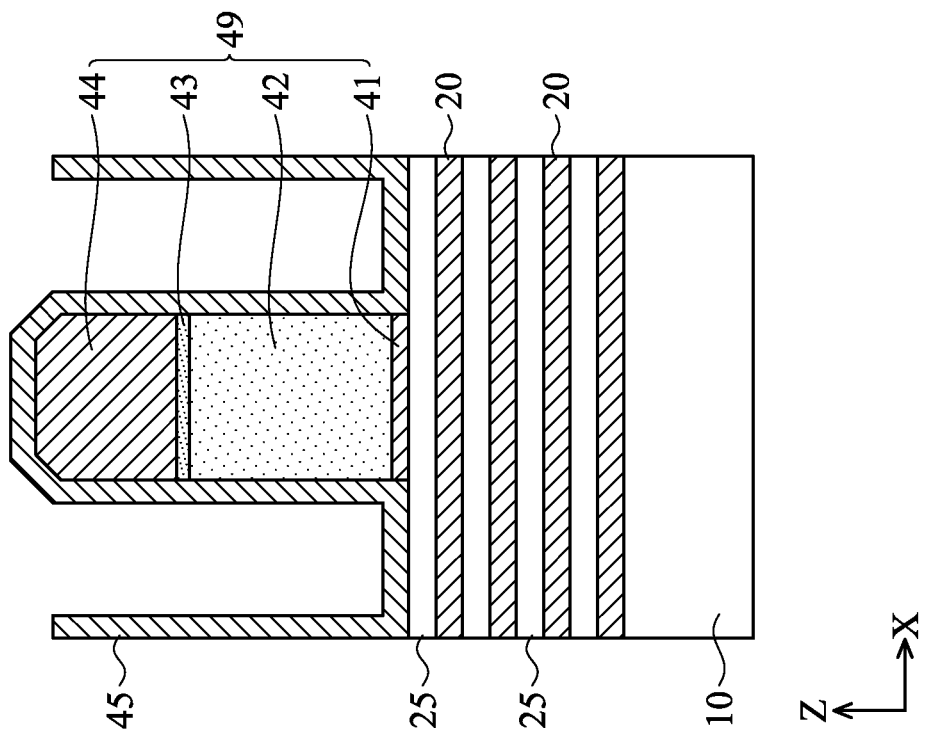
FIGS. 8A and 8B show one of the various operations of manufacturing a semiconductor GAA FET device according to an embodiment of the present disclosure.
Figure 8B:
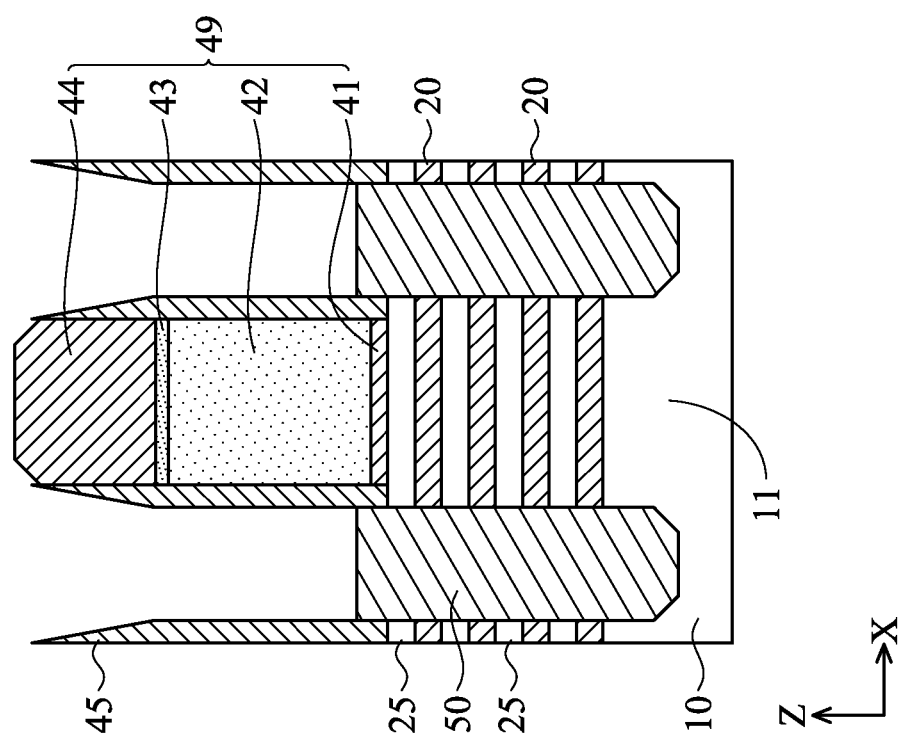

Subsequently, as shown in FIG. 8A, a source/drain epitaxial layer 50 is formed in the source/drain space 21, in the n-type region. The source/drain epitaxial layer 50 includes one or more layers of Si, Si:P (P doped Si), SiC and SiC:P (P doped SiC) for an n-channel FET. The source/drain epitaxial layer 50 is formed by an epitaxial growth method using CVD, ALD or molecular beam epitaxy (MBE). As shown in FIGS. 8A and 8B, the source/drain epitaxial layer 50 is selectively formed on semiconductor regions. The source/drain epitaxial layer 50 is formed in contact with end faces of the second semiconductor layers 25. In FIG. 8B, after the selective deposition of the source/drain epitaxial layer, the protective cover 101 covering the p-type region is removed.

Figures 9A, 9B:
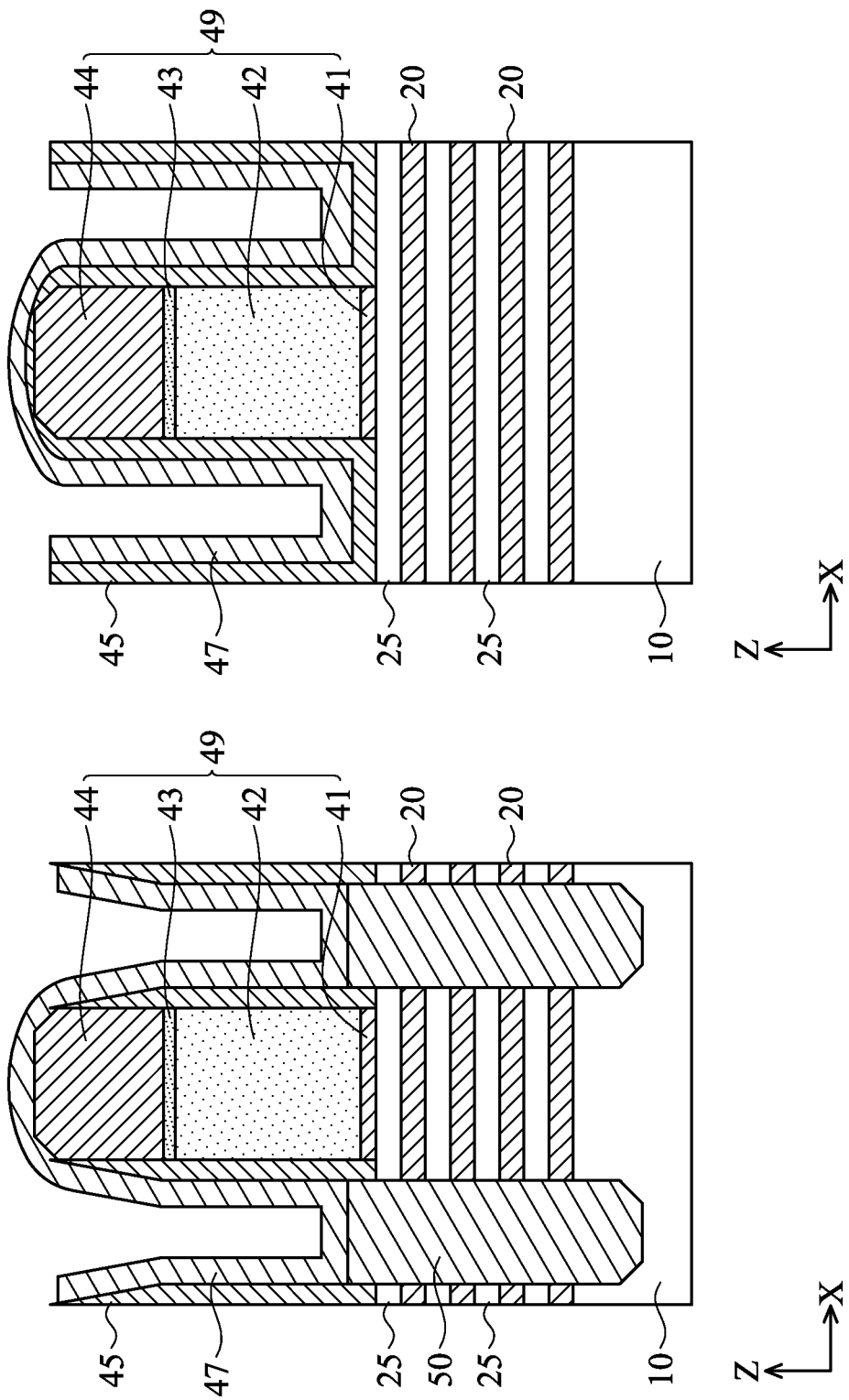
FIGS. 9A and 9B show one of the various operations of manufacturing a semiconductor GAA FET device according to an embodiment of the present disclosure.

Then, as shown in FIGS. 9A and 9B, a second cover layer 47 is formed both in the n-type region and the p-type region. The second cover layer 47 includes one of silicon nitride and silicon oxide ($SiO_2$), SiON, SiOC, SiCN and SiOCN, or any other suitable dielectric material. The second cover layer 47 is made of a different material than the sidewall spacers (first cover layer) 45. The second cover layer 47 can be formed by atomic layer deposition (ALD) or any other suitable methods.

Figure 10A:
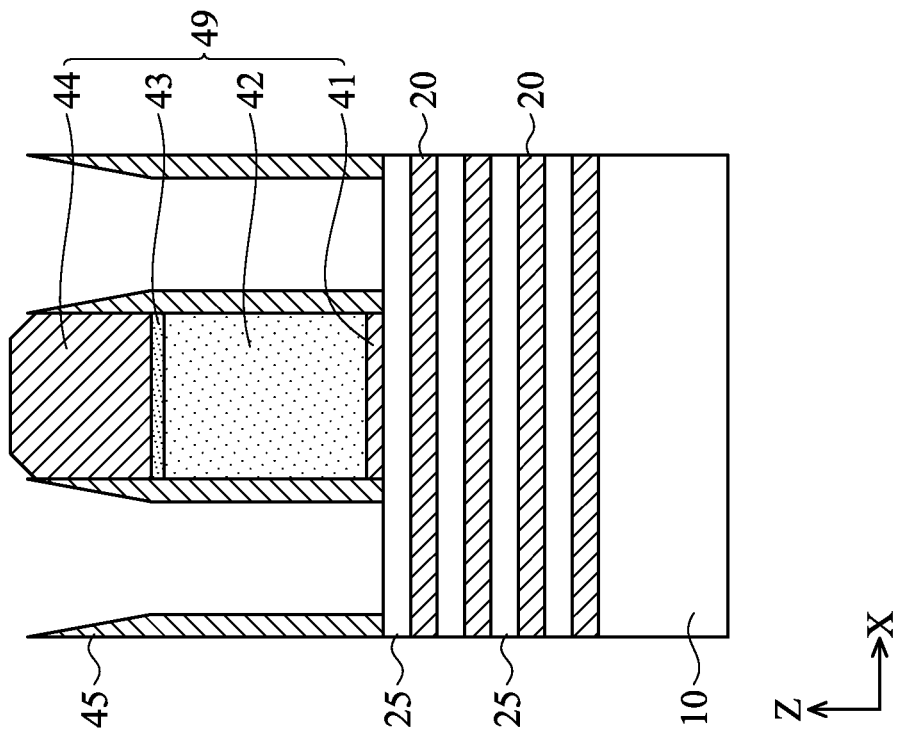
FIGS. 10A and 10B show one of the various operations of manufacturing a semiconductor GAA FET device according to an embodiment of the present disclosure.
Figure 10B:
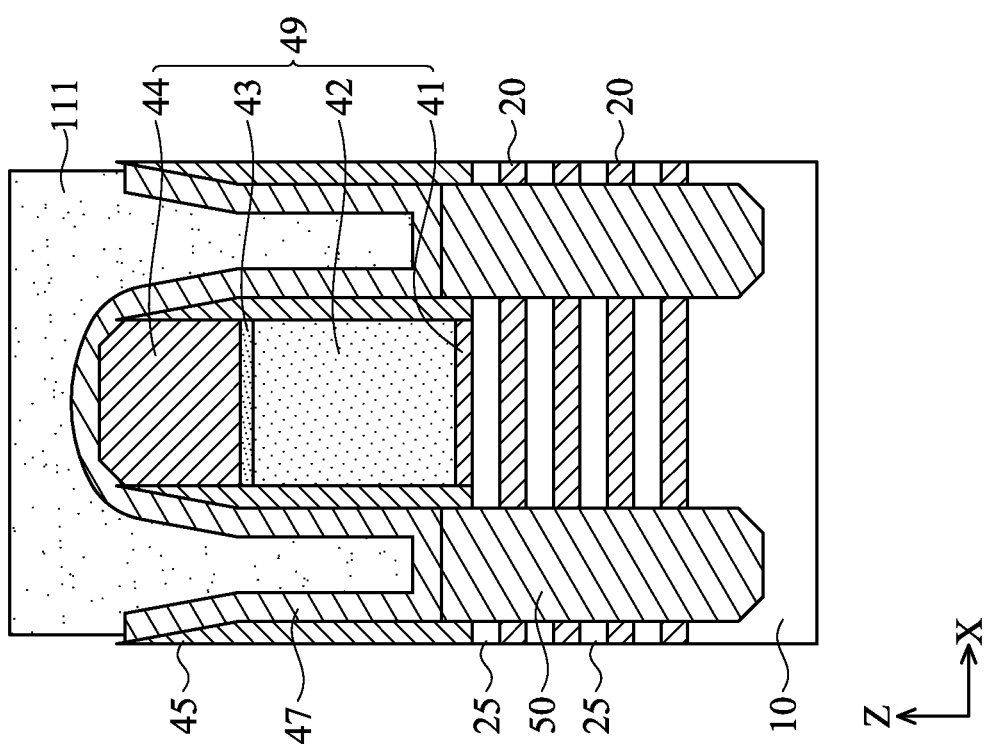

Next, as shown in FIGS. 10A and 10B, while the n-type region is covered by a protective layer 111, for example, a photoresist pattern, the second cover layer 47 in the p-type region is removed. Further, the first cover layer 45 is anisotropically etched to remove the first cover layer 45 disposed on the source/drain region so as to expose the source/drain region, while leaving the first cover layer 45 as sidewall spacers on side faces of the sacrificial gate structure 49 in the p-type region.

Figure 11B:
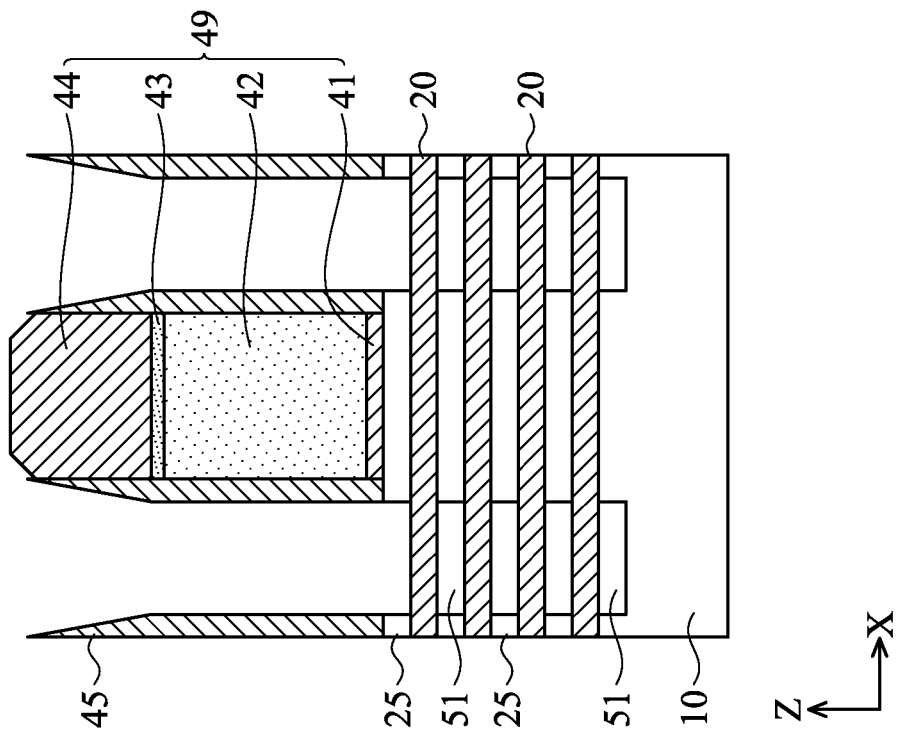
FIGS. 11A and 11B show one of the various operations of manufacturing a semiconductor GAA FET device according to an embodiment of the present disclosure.
Figure 11A:
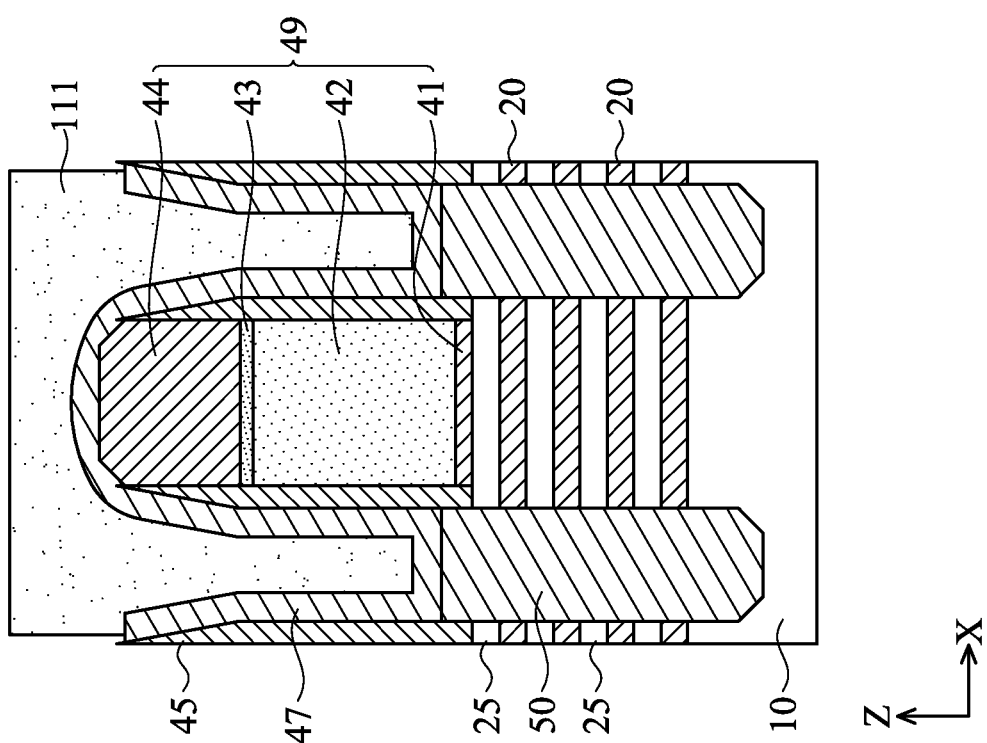

Further, as shown in FIG. 11B, the second semiconductor layer 25 in the source/drain region of the fin structure, which is not covered by the sacrificial gate structure, is etched, thereby leaving the first semiconductor layers 20 in the source/drain region. During the etching in the p-type region in FIG. 11B, the n-type region in FIG. 11A is covered by the protective layer 111 in some embodiments. In other embodiments, the protective layer 111 in the n-type region in FIG. 11A is removed before etching the source/drain region in the p-type region, and the second cover layer 47 protects the n-type region. In the p-type region, the second semiconductor layers 25 are laterally etched in the X direction within the source/drain space 51, thereby forming cavities 51, as shown in FIG. 11B. When the first semiconductor layers 20 are Ge or SiGe and the second semiconductor layers 25 are Si, the second semiconductor layers 25 can be selectively etched by using a wet etchant such as, but not limited to, an ammonium hydroxide (NH$_4$OH) solution and/or a tetramethylammonium hydroxide (TMAH) solution along a selected appropriate crystal orientation (such as <001>, <101>, or <110>, etc.) of the second semiconductor layers 25.

Figure 12A:
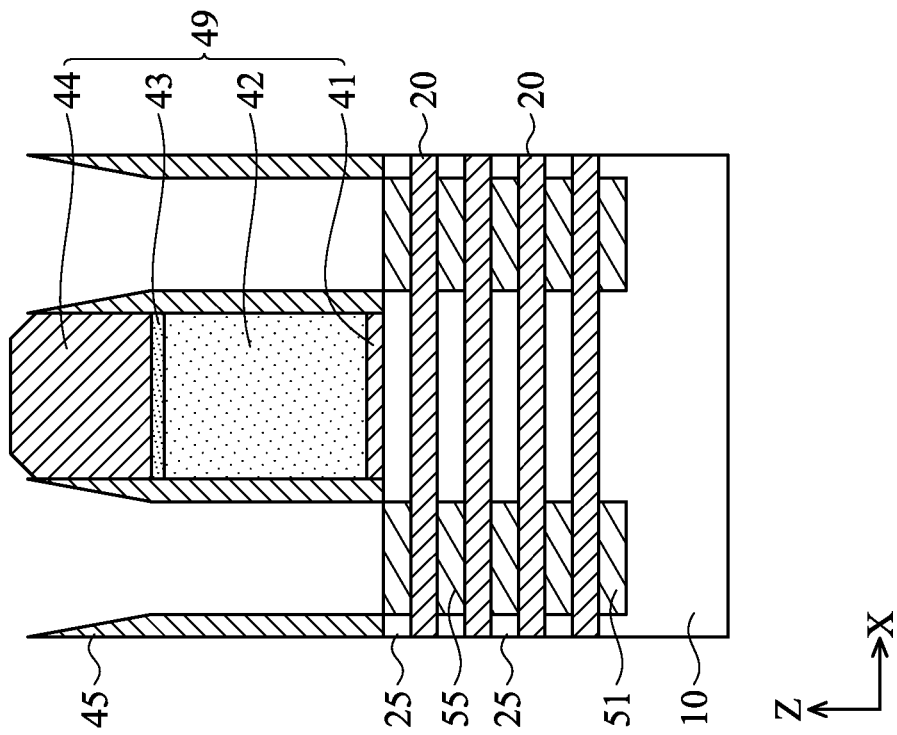
FIGS. 12A and 12B show one of the various operations of manufacturing a semiconductor GAA FET device according to an embodiment of the present disclosure.
Figure 12B:
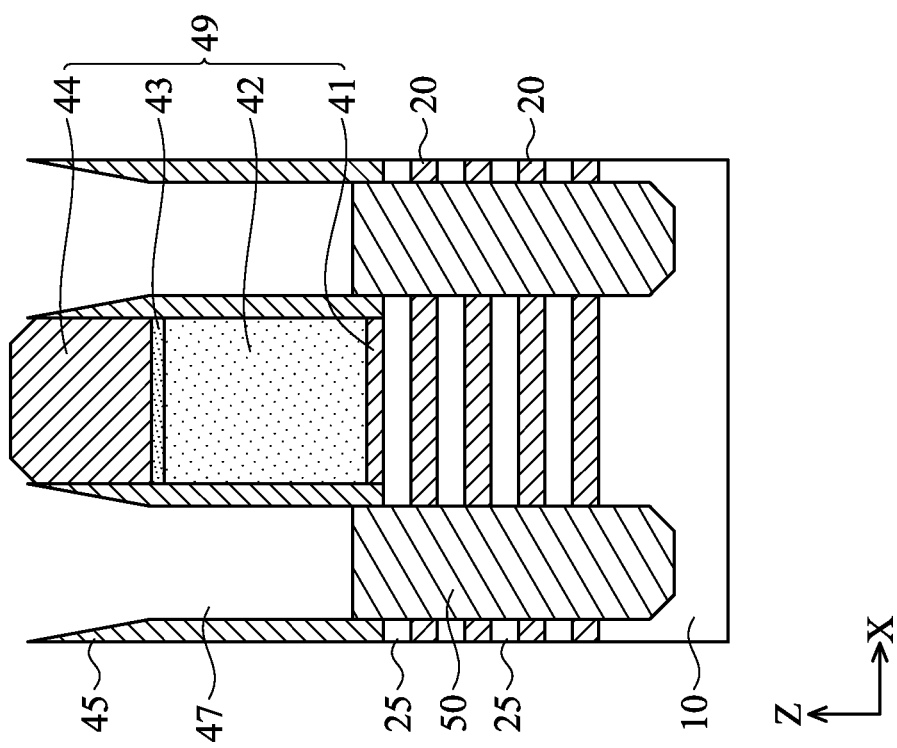

Subsequently, as shown in FIGS. 12A and 12B, a source/drain epitaxial layer 55 is formed in the source/drain space 51 (FIG. 11B), in the p-type region. The source/drain epitaxial layer 55 includes one or more layers of Si, SiGe and Ge for a p-channel FET. For the p-channel FET, boron (B) may also be contained in the source/drain. The source/drain epitaxial layer 55 is formed by an epitaxial growth method using CVD, ALD or molecular beam epitaxy (MBE). The source/drain epitaxial layer 55 is formed to wrap around portions of the first semiconductor layers 20. In some embodiments, the first semiconductor layers 20 pass through the source/drain epitaxial layer 55 (e.g. FIG. 16B). After the source/drain epitaxial layer 55 is selectively formed on semiconductor regions in the p-type region, the second cover layer 47 in the n-type region is removed, as shown in FIG. 12A.

Subsequently, an interlayer dielectric (ILD) layer 70 is formed over the source/drain epitaxial layers 50 and 55. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, a protective layer is formed to cover the p-type region, and the first semiconductor layers 20 are removed in the n-type region, thereby forming wires (channel regions) of the second semiconductor layers 25, as shown in FIG. 13A. FIG. 13A shows that the first semiconductor layers 20 are partially removed, and portions of the first semiconductor layers 20 contacting the source/drain epitaxial layers remain. The remaining portions of the first semiconductor layers 20 between the second semiconductor layers 25 have a cross-sectional recess shape. In some embodiments, the first semiconductor layers 20 are completely etched and the surface of the source/drain epitaxial layers 50 contacting the first semiconductor layers 20 is also etched to form recesses. The first semiconductor layers 20 can be removed or etched using an etchant that can selectively etch the first semiconductor layers 20 against the second semiconductor layers 25, as set forth above. In some embodiments, first semiconductor layers 20 are etched using wet etching utilizes an HCl acid solution or a mixed solution of NH$_4$OH, H$_2$O$_2$ and H$_2$O. When the first semiconductor layers 20 are Ge or SiGe and the second semiconductor layers 25 are Si, the first semiconductor layers 20 can be selectively etched by using a wet etchant such as, but not limited to, an HCl solution. By using the HCl acid solution and by selecting an appropriate crystal orientation of the first semiconductor layers 20, the etched surface of the end faces of the first semiconductor layers 20 have a recess shape, defined by the facets of the first semiconductor layers 20. After selective etching of the first semiconductor layers 20, the protective layer 101 in the p-type region is removed (now shown).

As shown in FIG. 13A, since there is no etch stopping layer formed adjacent to the source/drain epitaxial layer 50, etching does not stop at a vertical plane of the outer surface of the sidewall spacer 45, and portions of the first semiconductor layers 20 positioned underneath the sidewall spacers 45 are etched. Under each sidewall spacer 45, a portion of the first semiconductor layer 20 remains and has a recess having a cross-sectional shape along X-direction depending on the facets obtained by selective etching the first semiconductor layers 20 to form the recess shape, for example, the recesses of the remaining first semiconductor layers 20, after etching, of the embodiment in FIG. 13A have a circular concave cross-sectional shape along X-direction. Other possible cross-sectional shapes along X direction include a triangular recess having (111) facet and a pentagonal recess having (100) and (110) facets. In some embodiments, although not shown in FIG. 13A, the first semiconductor layer 20 can be completely etched and the source/drain epitaxial layer 50 is etched to have a recess having the above described cross-sectional shapes. The channel formation operations for the n-type region are performed, while the p-type region is covered by a protective layer.

Similarly, the second semiconductor layers 25 are removed in the p-type region, thereby forming wires (channel regions) of the first semiconductor layers 20, as shown in FIG. 13B. The second semiconductor layers 25 can be removed or etched using an etchant that can selectively etch the second semiconductor layers 25 against the first semiconductor layers 20, as set forth above. As shown in FIG. 13B, since there is no etch stopping layer formed adjacent to the source/drain epitaxial layer 55, etching does not stop at a vertical plane of the outer surface of the sidewall spacer 45, and portions or entirety of the second semiconductor layers 25 positioned underneath the sidewall spacers 45 are etched. In some embodiments, although not shown in FIG. 13B, under each sidewall spacer 45, a portion of the second semiconductor layer 25 remains and has a recess having a cross-sectional shape along X-direction depending on the facets, for example, the recesses of the remaining second semiconductor layers 25, after etching, of the embodiment in FIG. 13B have a circular concave cross-sectional shape along X-direction. Other possible cross-sectional shapes along X direction include a triangular recess having (111)

facet and a pentagonal recess having (100) and (110) facets. As shown in FIG. 13B, the second semiconductor layer 25 is completely etched and a portion of the each of the source/drain epitaxial layer 55 is etched to have a recess having any of the above described cross-sectional shapes. The channel formation operations for the p-type region are performed, while the n-type region is covered by a protective layer. The formation of the channel regions for the p-type region can be performed after the formation of the channel regions for the n-type region.

Figures 14A, 14B:
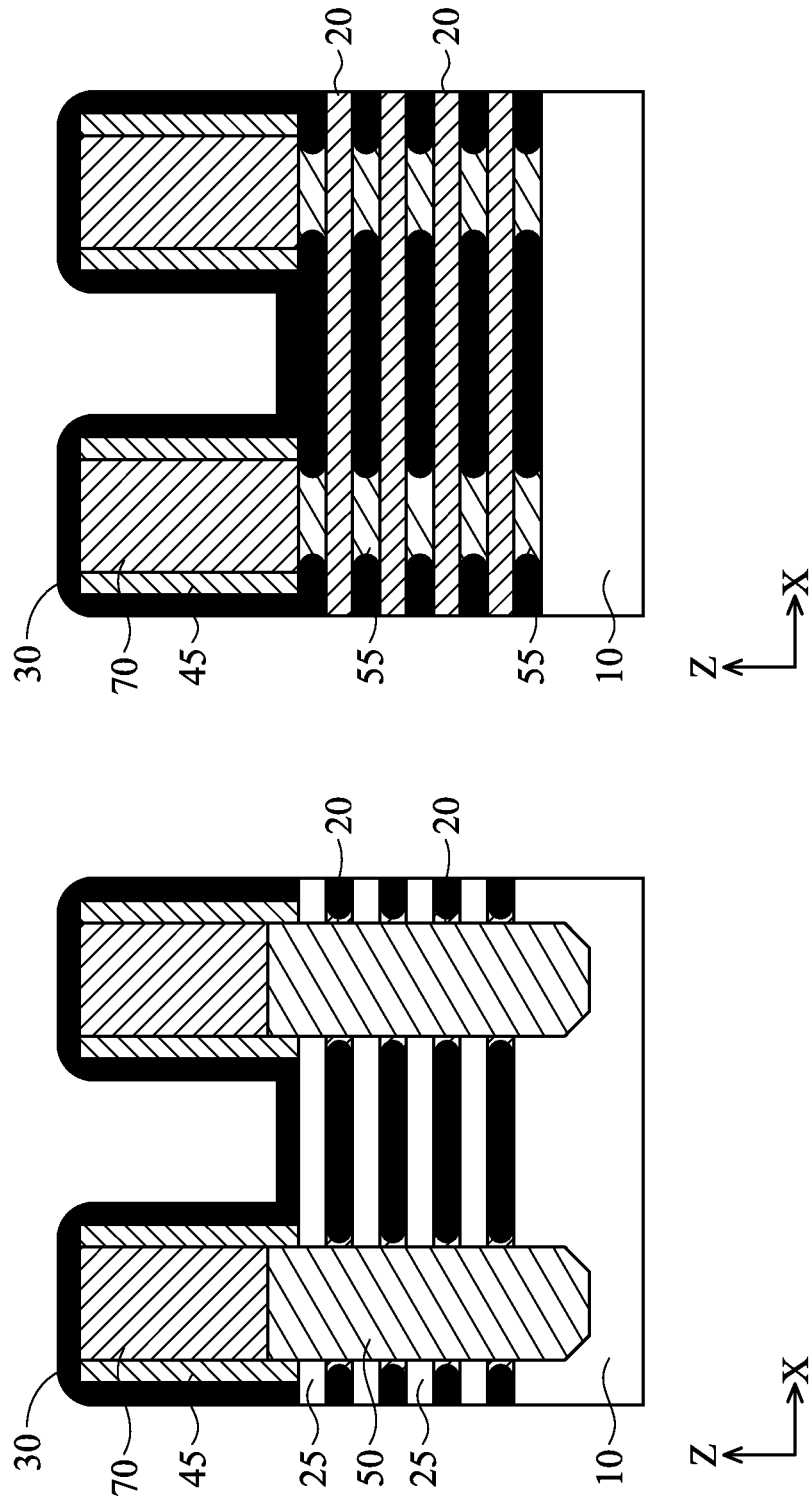
FIGS. 14A and 14B show one of the various operations of manufacturing a semiconductor GAA FET device according to an embodiment of the present disclosure.

In FIGS. 14A and 14B, a first insulating layer 30 is conformally formed on the etched lateral ends of the first semiconductor layers 20 and on end faces of the second semiconductor layers 25 in the source/drain space 21 and over the sacrificial gate structure. The first insulating layer 30 includes one of silicon nitride and silicon oxide ($SiO_2$), SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. In some embodiments, the first cover layer 30 fully fills the spaces around the semiconductor wires 20 and 25 as shown in FIGS. 15A and 15B, and in other embodiments, the first cover layer 30 only partially fills the spaces around the semiconductor wires 20 and 25.

Figures 15A, 15B:
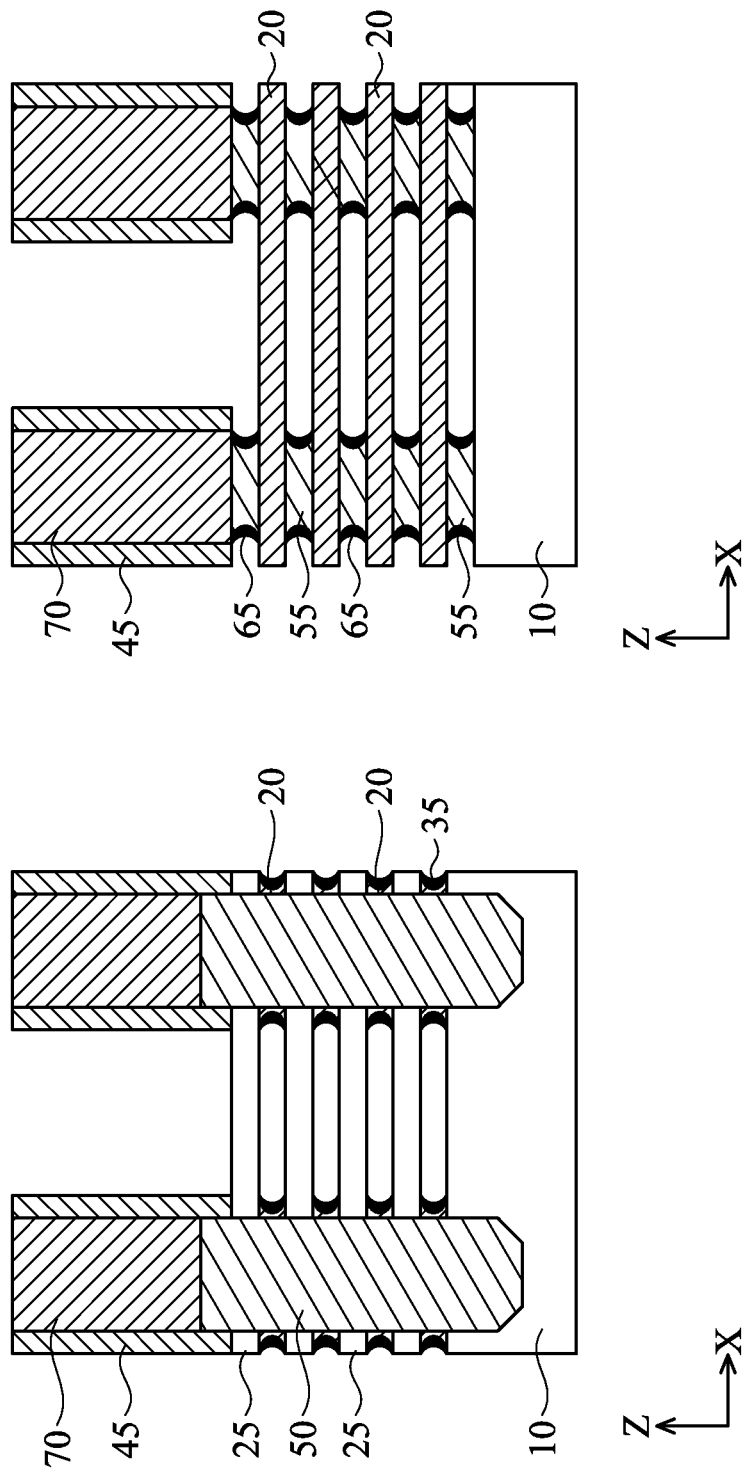
FIGS. 15A and 15B show one of the various operations of manufacturing a semiconductor GAA FET device according to an embodiment of the present disclosure.

After the first insulating layer 30 is formed, an etching operation is performed to partially remove the first insulating layer 30, thereby forming inner spacers 35 for the n-type region as shown in FIG. 15A and inner spacers 65 for the p-type region as shown in FIG. 15B. That is, anisotropic etching is performed to remove all the materials of the first insulating layer 30 except the materials of the first insulating layer 30 in the recess. In this embodiment shown in FIGS. 14A and 14B, a protective layer is not used, and in such a case, the first insulating layer 30 in the p-type region is simultaneously removed during the etching operation performed in the n-type region. In some embodiments, the p-type region is covered by a protective layer while the n-type region is undergoing etching. In some embodiments, before forming the first insulating layer 30, an additional insulating layer having a smaller thickness than the first insulating layer 30 is formed, and thus the inner spacers 35 have a two-layer structure. The first insulating layer 30 is formed to fill the recesses formed in the remaining first semiconductor layer 20 or the recesses formed in the source/drain epitaxial layer 50 when the first semiconductor layer 20 is completely removed, and after etching, becomes inner spacers 35 or 65. Also, because the recesses are formed in the remaining first semiconductor layer 20 below the sidewall spacer 45 or in the source/drain epitaxial layer 50, the inner spacers 35 or 65 are formed in a region not including the gate electrode 84, in some embodiments. That is, in some embodiments, the inner spacers 35 or 65 are formed in a region below the sidewall spacer 45. In some embodiments, the inner spacers 35 or 65 are formed in source/drain region. Because of the shape of the recess in which the inner spacers 35 or 65 are formed, the inner spacer 35 or 65 has a cross-sectional shape convex toward the adjacent source/drain region, in some embodiments. The surface of the inner spacer 35 or 65 opposite to the convex shape may have a recess surface (FIGS. 17A, 17D, and 17E) or a flat surface (FIGS. 17B and 17C) contacting the gate dielectric layer 82, in some embodiments. After selective etch, the recess opens toward the gate electrode layer 84 and positioned in the gap between two wires (an upper wire and a lower wire with respect to the gap).

Figure 16A:
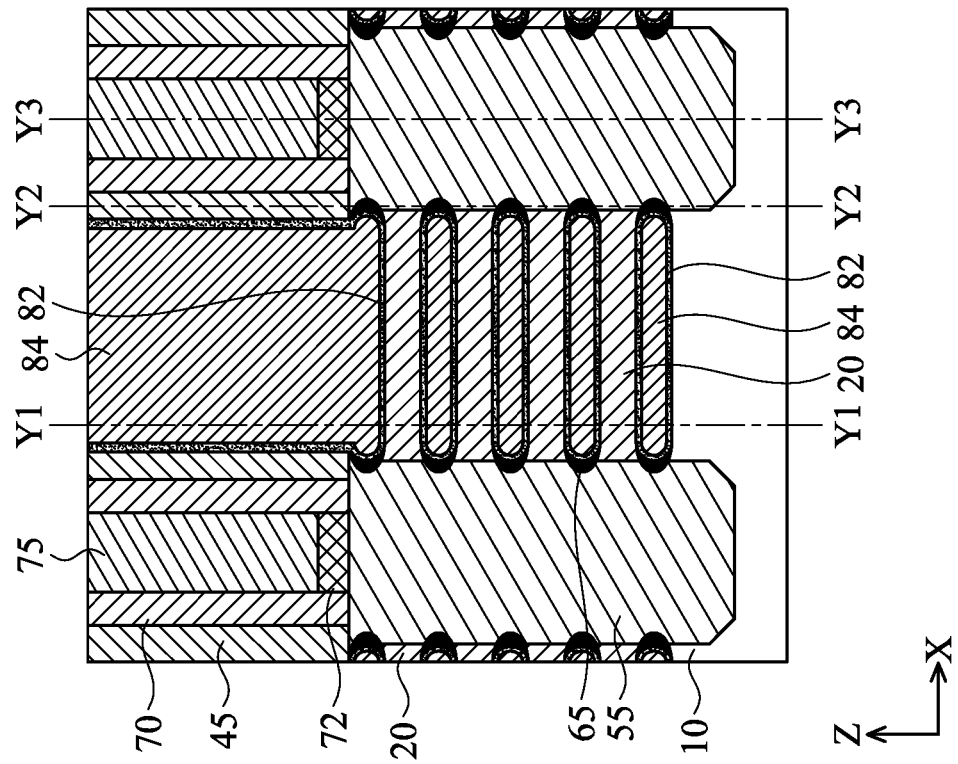
FIGS. 16A and 16B show one of the various operations of manufacturing a semiconductor GAA FET device according to an embodiment of the present disclosure.
Figure 16B:
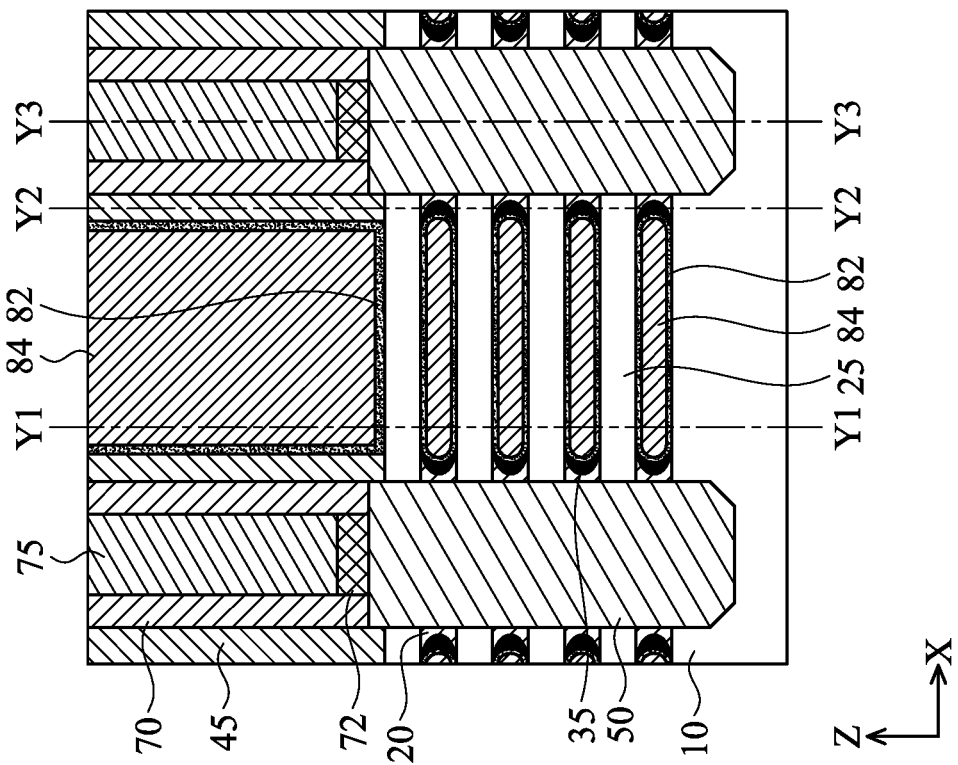

In FIGS. 16A and 16B, after the inner spacers 35 for the n-type region and the inner spacers 65 for the p-type region are formed, a gate dielectric layer 82 is formed around each channel layer for the n-type region and the p-type region. A gate electrode layer 84 is subsequently formed on the gate dielectric layer 82, as shown in FIGS. 16A and 16B. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

Figure 17A:
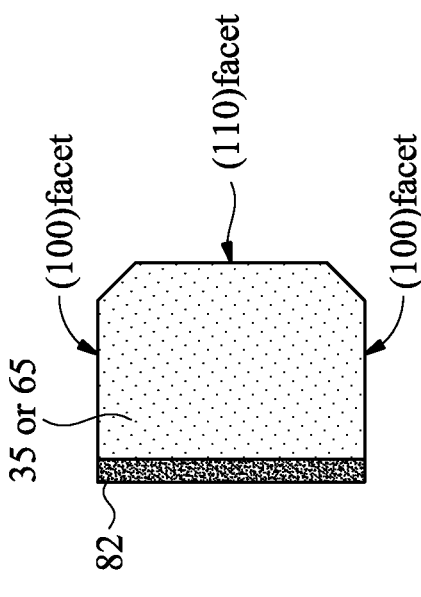
FIGS. 17A, 17B, 17C, 17D, and 17E show various inner spacers coated with gate dielectric layers, according to embodiments of the present disclosure.
Figure 17B:
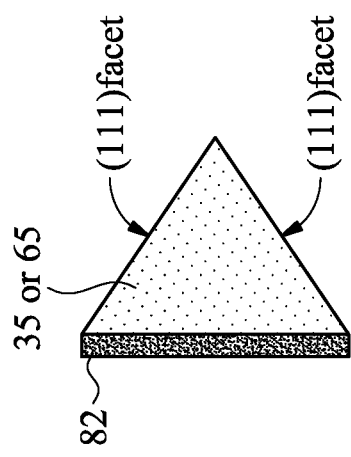
Figure 17C:
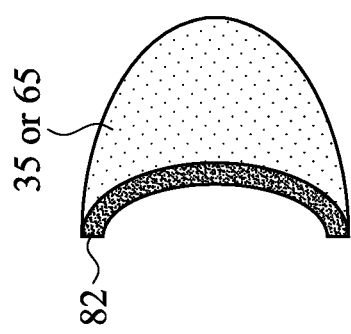
Figure 17D:
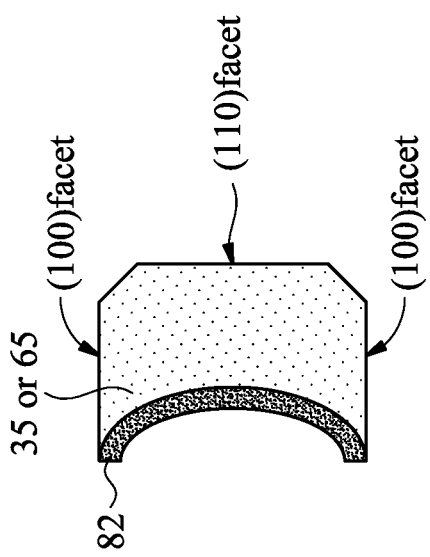
Figure 17E:
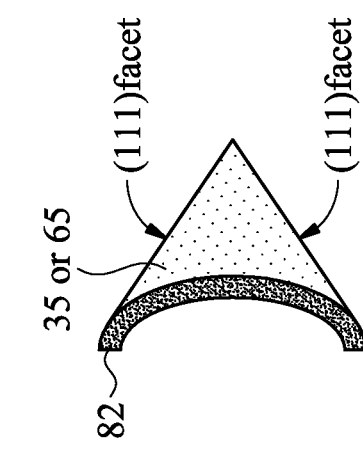

FIGS. 17A, 17B, 17C, 17D, and 17E show various embodiments of inner spacers 35 or 65 coated with gate dielectric layer 82. As shown in FIGS. 17A, 17B, 17C, 17D, and 17E, the portions of the inner spacers 35 or 65 not coated by the gate dielectric layer 82 are formed in recesses provided in a region not overlapping the gate electrode layer 84. The formation of the surface of the portion of the inner spacers 35 or 65 depends on the facets provided in the source/drain region by appropriately selecting the principal surface orientation of the semiconductor substrate 10 and/or types of etching solutions used to remove the first and/or second semiconductor layers. FIGS. 17B and 17D show (111) facets of the inner spacers 35 or 65 while FIGS. 17C and 17E show (100) and (110) facets of the inner spacers 35 or 65. By engineering the facets provided in the source/drain region by, for example, appropriately selecting the principal surface orientation of the semiconductor substrate 10 and/or types of etching solutions used to remove the first and/or second semiconductor layers, the shape of the inner spacers 35 or 65 can be designed for specific purposes, in some embodiments. In FIGS. 17A, 17B, 17C, 17D, and 17E, the inner spacers 35 or 65 have cross-sectional shape convex toward the adjacent source/drain region and the surface opposite to the convex shape may have a recess shape (FIGS. 17A, 17D, and 17E) or a flat shape (FIGS. 17B and 17C), in some embodiments.

The various embodiments or examples described herein offer several advantages over the existing art. For example, in the present disclosure, in a GAA FET, an inner spacer has a cross-sectional shape formed in a recess provided in the source/drain region. The inner spacer in this disclosure does not require extra space as it is formed in the recess provided in the source/drain region. Also, the inner spacers reinforce the structure of the n-type or p-type region and provide ultimate electrical property for the device. The methods disclosed herein uniformly form the inner spacers by using wet etching. With the foregoing embodiments, it is possible to more precisely control the thickness, the shape and/or the location of the inner spacers and thus to control capacitances around the source/drain and the gate.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. A source/drain epitaxial layer is formed in the source/drain space. After the source/drain epitaxial layer is formed, the sacrificial gate structure is removed, thereby exposing a part of the fin structure. The first semiconductor layers are removed from the exposed fin structure, thereby forming channel layers including the second semiconductor layers. Recesses are formed toward the source/drain epitaxial layer where the first semiconductor layers were removed. Inner spacers are formed in the recesses. A gate dielectric layer is formed to cover the inner spacers and a gate electrode layer is formed around the second semiconductor layer. The gate electrode layer is isolated from the source/drain epitaxial layer by the inner spacer and the gate dielectric layer. In one or more of the foregoing or following embodiments, the recesses are formed in a region not overlapping the gate electrode layer. In one or more of the foregoing or following embodiments, the recesses are formed in the source/drain region. In one or more of the foregoing or following embodiments, the removing the first semiconductor layers is carried out by wet etching. In one or more of the foregoing or following embodiments, the wet etching utilizes an HCl acid solution or a mixed solution of $NH_4OH$, $H_2O_2$ and $H_2O$. In one or more of the foregoing or following embodiments, the inner spacer is formed by forming a dielectric layer in the recesses, and etching the dielectric layer. In one or more of the foregoing or following embodiments, the etched dielectric layer has a concave or flat outer surface. In one or more of the foregoing or following embodiments, the inner spacers include at least one of silicon nitride and silicon oxide. In one or more of the foregoing or following embodiments, the inner spacers include at least one of SiOC, SiOCN and SiCN. In one or more of the foregoing or following embodiments, the gate dielectric layer contacting the inner spacer has a concave or flat shape. In one or more of the foregoing or following embodiments, in the operation of removing the first semiconductor layers, the first semiconductor layers in the exposed fin structure are selectively etched, thereby leaving the second semiconductor layers remaining. In one or more of the foregoing or following embodiments, the second semiconductor layer is a nanowire layer. In one or more of the foregoing or following embodiments, the recesses are formed in remaining portions of the first semiconductor layers contacting the source/drain epitaxial layer.

In accordance with an aspect of the present disclosure, a semiconductor device includes semiconductor wires disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and dielectric spacers disposed in recesses formed toward the source/drain epitaxial layer. In one or more of the foregoing or following embodiments, the dielectric spacers include at least one of silicon nitride and silicon oxide. In one or more of the foregoing or following embodiments, the semiconductor wires are made of Si. In one or more of the foregoing or following embodiments, the semiconductor wires are made of SiGe. In one or more of the foregoing or following embodiments, the dielectric spacers are in contact with the source/drain epitaxial layer. In one or more of the foregoing or following embodiments, the dielectric spacers are spaced apart from the source/drain epitaxial layer.

In accordance with another aspect of the present disclosure, a semiconductor device includes semiconductor wires disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and dielectric spacers having a concave or flat outer surface disposed in recesses formed toward the source/drain epitaxial layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternately stacked;
    forming a sacrificial gate structure over the fin structure;
    forming gate sidewall spacers on opposing side faces of the sacrificial gate structure;
    etching a source/drain region of the fin structure, which is not covered by the sacrificial gate structure, thereby forming a source/drain space;
    forming a source/drain epitaxial layer in the source/drain space;
    removing the sacrificial gate structure, thereby exposing a part of the fin structure;
    laterally etching the first semiconductor layers from the exposed fin structure to form recesses under the gate sidewall spacers;
    forming inner spacers in the recesses; and
    forming a gate dielectric layer covering the inner spacers and forming a gate electrode layer around the second semiconductor layer,
    wherein each of the inner spacers has a two-layer structure.

2. The method of claim 1, wherein each of the inner spacers has a curved face in a cross section.

3. The method of claim 2, wherein the curved face is a convex shape toward the source/drain epitaxial layer.

4. The method of claim 1, wherein each of the inner spacers has curved faces, one of which is a convex shape toward the source/drain epitaxial layer and the other one of which is convex shape toward the gate electrode in a cross section.

5. The method of claim 1, wherein the inner spacers include at least one of silicon nitride and silicon oxide.

6. The method of claim 1, wherein the inner spacers include at least one of SiOC, SiOCN and SiCN.

7. The method of claim 1, wherein each of the inner spacers has a tapered shape having a smaller width toward the source/drain epitaxial layer.

8. The method of claim 1, wherein in the removing the first semiconductor layers, part of the first semiconductor layers remains, and the inner spacers are formed on the remaining part of the first semiconductor layers.

9. The method of claim 8, wherein the remaining part of the first semiconductor layers contacts the source/drain epitaxial layer.

10. A method of manufacturing a semiconductor device, comprising:
    forming a fin structure in which first semiconductor layers and second semiconductor layers are alternately stacked;
    forming a sacrificial gate structure over a middle portion of the fin structure, wherein a first portion and a second portion of the fin structure are exposed;
    removing the first semiconductor layers from the exposed first portion and second portion of the fin structure;
    forming a source/drain epitaxial layer over the first portion and the second portion of the fin structure to form a source/drain region, wherein the epitaxial layer wraps around the second semiconductor layers of the first portion and the second portion;
    removing the sacrificial gate structure, thereby exposing the middle portion of the fin structure;
    removing the first semiconductor layers from the exposed middle portion of the fin structure;
    forming recesses at both ends of locations of the first semiconductor layers toward the source/drain epitaxial layer;
    forming dielectric spacers in the recesses; and
    forming a gate dielectric layer covering the dielectric spacers and forming a gate electrode layer around the second semiconductor layers of the middle portion of the fin structure,
    wherein each of the dielectric spacers has a multi-layer structure.

11. The method of claim 10, wherein the dielectric spacers include at least one of silicon nitride and silicon oxide.

12. The method of claim 10, wherein the second semiconductor layers are made of Si.

13. The method of claim 10, wherein the second semiconductor layers are made of SiGe.

14. The method of claim 10, wherein the dielectric spacers are in contact with the source/drain epitaxial layer.

15. The method of claim 14, wherein the dielectric spacers in contact with the source/drain epitaxial layer having a facet including <100>, <110>, and <001>.

16. A method of manufacturing a semiconductor device, comprising:
    forming a fin structure in which first semiconductor layers and second semiconductor layers are alternately stacked;
    forming a sacrificial gate structure over the fin structure;
    forming gate sidewall spacers on opposing side faces of the sacrificial gate structure;
    forming a source/drain epitaxial layer to connect the second semiconductor layers;
    removing the sacrificial gate structure, thereby forming a gate space in which a part of the fin structure is exposed;
    laterally etching the first semiconductor layers in the gate space toward the source/drain epitaxial layer to form recesses under the gate sidewall spacers;
    forming inner spacers in the recesses; and
    forming a gate dielectric layer covering the inner spacers and forming a gate electrode layer around the second semiconductor layer, wherein each of the inner spacers has a curved face, which is a convex shape convex toward the source/drain epitaxial layer.

17. The method of claim 16, wherein the inner spacers include at least one of silicon nitride and silicon oxide.

18. The method of claim 16, wherein the inner spacers include at least one of SiOC, SiOCN and SiCN.

19. The method of claim 16, wherein in the removing the first semiconductor layers, part of the first semiconductor layers remains, and the inner spacers are formed on the remaining part of the first semiconductor layers.

20. The method of claim 19, wherein the remaining part of the first semiconductor layers contacts the source/drain epitaxial layer.

* * * * *